(12) United States Patent
Horino

(10) Patent No.: US 9,354,392 B2
(45) Date of Patent: May 31, 2016

(54) SEMICONDUCTOR DEVICE AND METHOD FOR MANUFACTURING THE SAME

(71) Applicant: SUMITOMO ELECTRIC INDUSTRIES, LTD., Osaka-shi, Osaka (JP)

(72) Inventor: Kazuhiko Horino, Hadano (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/476,205

(22) Filed: Sep. 3, 2014

(65) Prior Publication Data

US 2016/0062037 A1 Mar. 3, 2016

(51) Int. Cl.
*G02B 6/12* (2006.01)
*G02B 6/122* (2006.01)
*H01L 21/02* (2006.01)
*G02B 6/13* (2006.01)
*G02B 6/136* (2006.01)

(52) U.S. Cl.
CPC .............. *G02B 6/1228* (2013.01); *G02B 6/131* (2013.01); *G02B 6/136* (2013.01); *H01L 21/02546* (2013.01); *H01L 21/02639* (2013.01); *H01L 21/02664* (2013.01); *G02B 2006/12097* (2013.01)

(58) Field of Classification Search
CPC ................... H01L 21/02639; H01L 21/02546; H01L 21/02664; H01L 21/2015; H01L 21/02433; G02B 6/131; G02B 6/136; G02B 6/1228; G02B 2006/12097
See application file for complete search history.

(56) References Cited

FOREIGN PATENT DOCUMENTS

JP 10-135563 5/1998

*Primary Examiner* — Armando Rodriguez
(74) *Attorney, Agent, or Firm* — Smith, Gambrell & Russell, LLP.

(57) ABSTRACT

A method for manufacturing a semiconductor device includes the steps of preparing a substrate; forming first and second layers on the substrate; forming a suspended mask on the substrate by etching the first and second layers, the suspended mask including a shield portion having a space between the second layer and the substrate, a terrace portion being disposed apart from the shield portion, a supporting portion connecting the shield portion and the terrace portion, and an opening between the shield portion and the terrace portion, the shield portion extending in a first direction; and growing a semiconductor layer on a surface of the substrate in the first region and the fourth region using the suspended mask. The shield portion has a width varying in the first direction, and the semiconductor layer has a thickness varying in the first direction.

11 Claims, 38 Drawing Sheets

FIG. 12

| W1 [μm] | W5=2×W3+W1 | | | |
|---|---|---|---|---|
| | 50μm | 70μm | 100μm | 140μm |
| 1 | ○ | ○ | ○ | ○ |
| 2 | ○ | ○ | ○ | ○ |
| 3 | ○ | ○ | ○ | ○ |
| 4 | ○ | ○ | ○ | ○ |
| 5 | ○ | ○ | ○ | ○ |
| 6 | ○ | ○ | ○ | ○ |
| 7 | ○ | ○ | ○ | ○ |
| 8 | ○ | ○ | ○ | ○ |
| 10 | ○ | ○ | ○ | ○ |
| 12 | ○ | ○ | ○ | ○ |
| 15 | × | ○ | ○ | ○ |
| 20 | × | ○ | ○ | ○ |

| W3 [μm] | L3 | | |
|---|---|---|---|
| | 1μm | 1.5μm | 2μm |
| 17.5 | ○ | ○ | ○ |
| 21.4 | ○ | ○ | ○ |
| 27.5 | ○ | ○ | ○ |
| 32.9 | ○ | ○ | ○ |
| 42.0 | ○ | ○ | ○ |
| 50.2 | ○ | ○ | ○ |
| 62.5 | × | ○ | ○ |
| 73.3 | × | × | ○ |
| 91.5 | × | × | × |

| W3 [μm] | L3 | | |
|---|---|---|---|
| | 1μm | 1.5μm | 2μm |
| 17.5 | ○ | ○ | ○ |
| 21.4 | ○ | ○ | ○ |
| 27.5 | ○ | ○ | ○ |
| 32.9 | ○ | ○ | ○ |
| 42.0 | × | ○ | ○ |
| 50.2 | × | × | ○ |
| 62.5 | × | × | × |
| 73.3 | × | × | × |
| 91.5 | × | × | × |

| W3 [μm] | L3 | | |
|---|---|---|---|
| | 1μm | 1.5μm | 2μm |
| 26.3 | ○ | ○ | ○ |
| 32.1 | ○ | ○ | ○ |
| 41.3 | ○ | ○ | ○ |
| 49.4 | ○ | ○ | ○ |
| 63.0 | ○ | ○ | ○ |
| 75.4 | ○ | ○ | ○ |
| 93.8 | × | ○ | ○ |
| 110.0 | × | × | ○ |
| 137.2 | × | × | × |

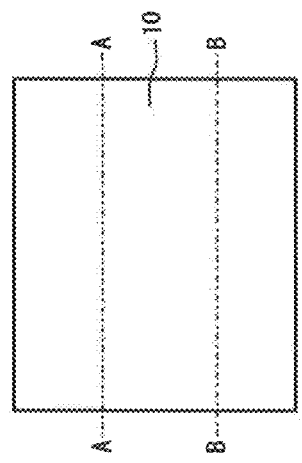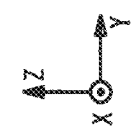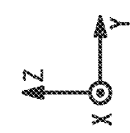

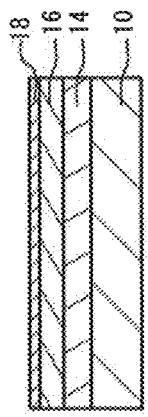
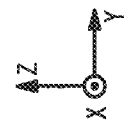
FIG. 19C
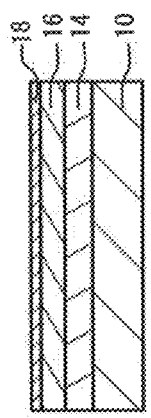
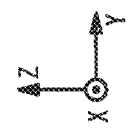
FIG. 19B
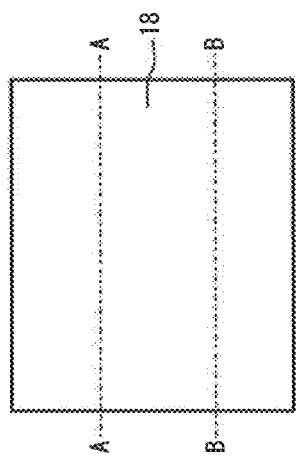
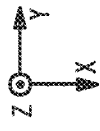
FIG. 19A

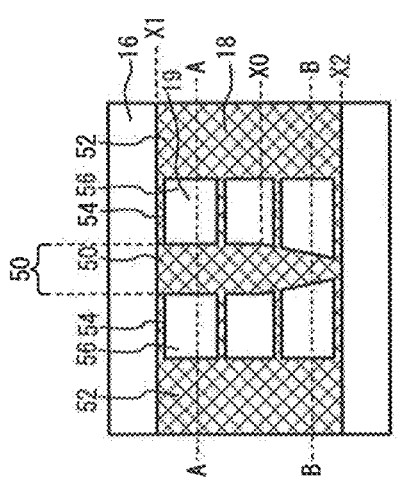

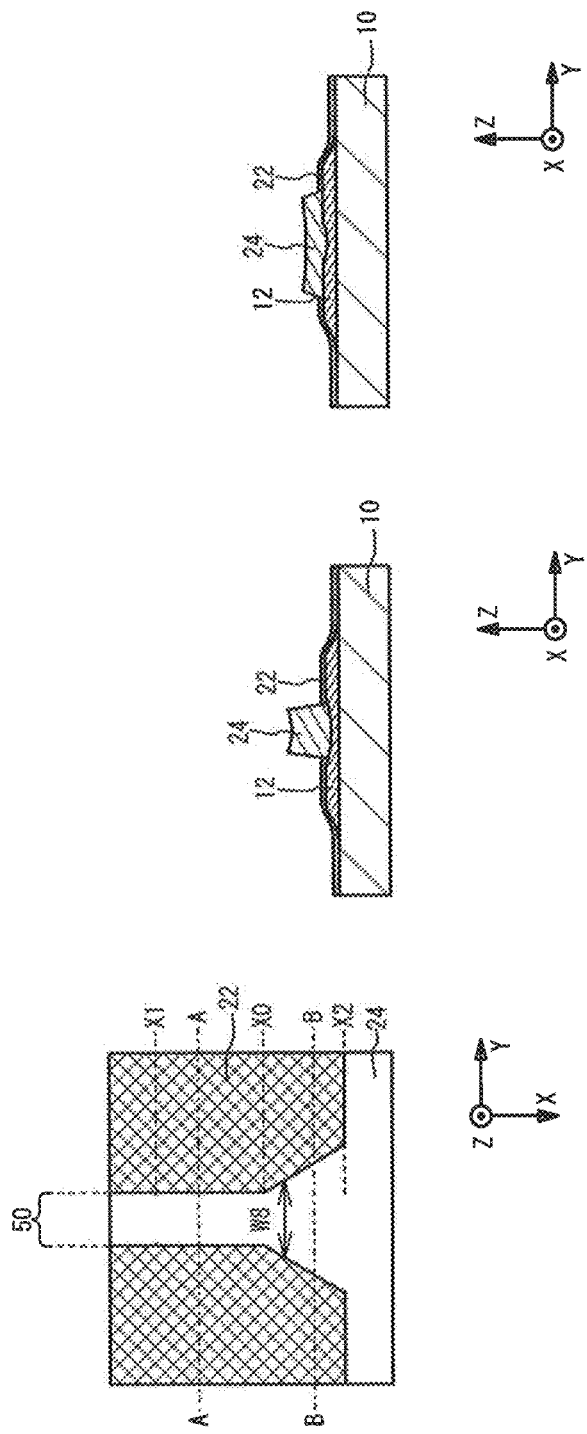

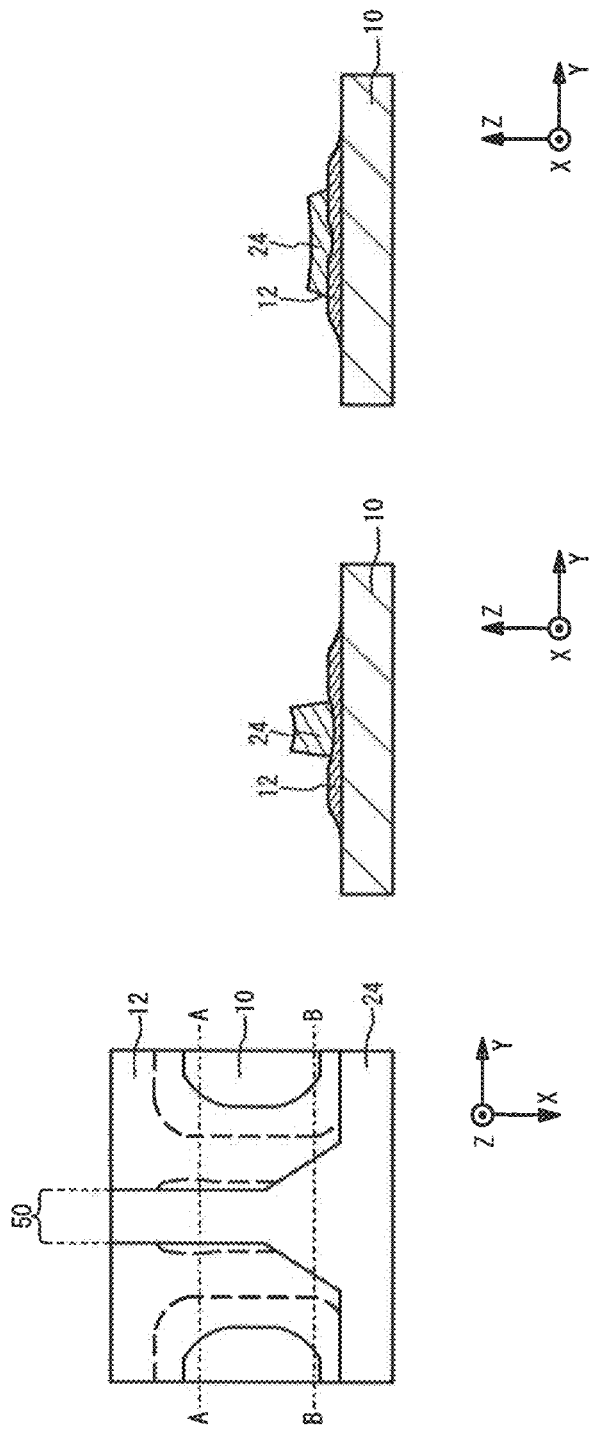

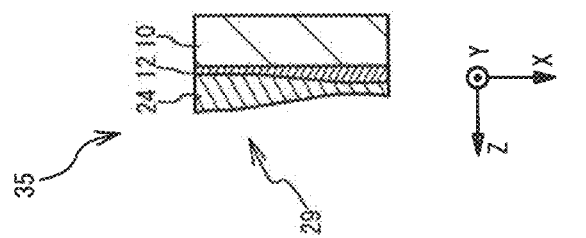
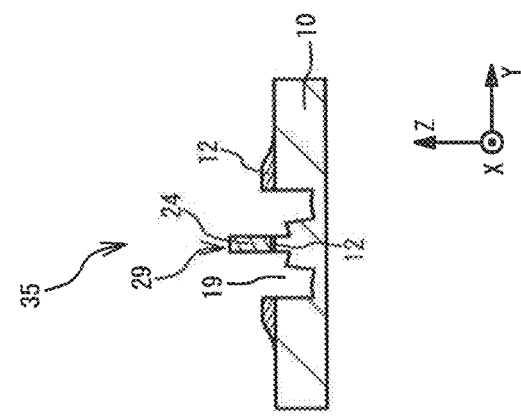
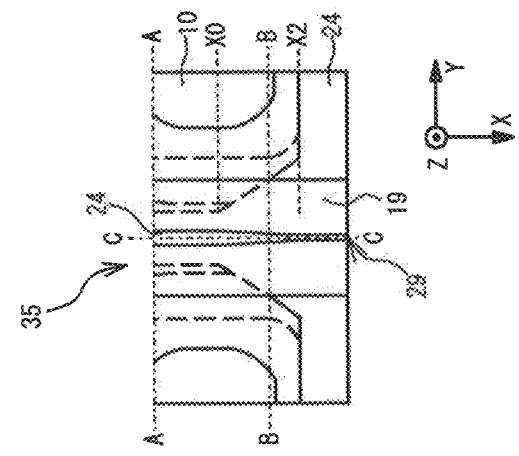

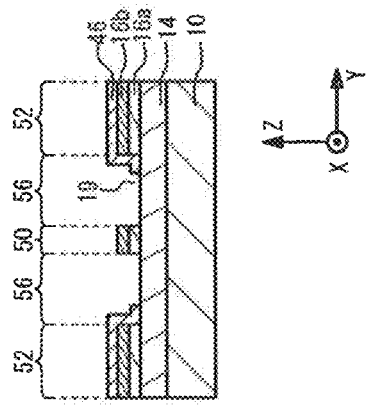
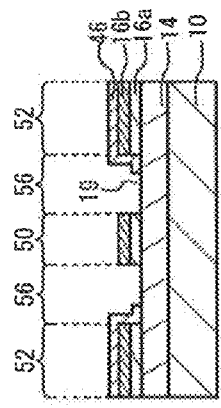
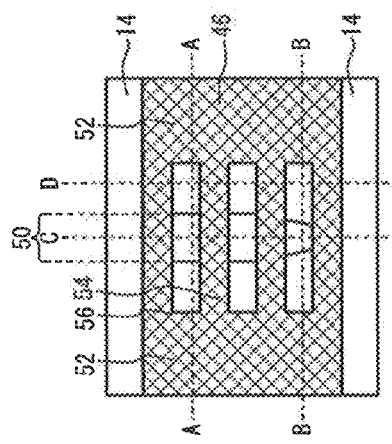
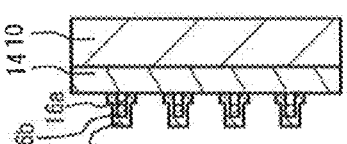
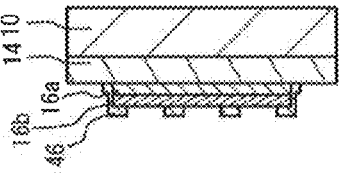

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and relates to a semiconductor device in which a semiconductor layer is deposited on a substrate, and a method for manufacturing the same.

2. Description of the Related Art

A semiconductor layer deposited on a substrate is used as an optical waveguide, Patent Document 1 (Japanese Unexamined Patent Application Publication No. 10-135563) describes a semiconductor layer whose thickness is varied, The variation of the thickness is formed by crystal growth using a shadow mask. The semiconductor layer whose thickness is varied is used as a waveguide, In the method of Patent Document 1, the thickness of the semiconductor layer is varied in the width direction of the waveguide,

SUMMARY OF THE INVENTION

In order to apply the waveguide to a spot-size convert, it is necessary to vary the thickness in the longer direction of the waveguide. It is difficult to vary the thickness in the longer direction compared rather than to vary in the width direction. In the variation in the longer direction, it is necessary to use a long shadow mask. However, in crystal growth using along shadow mask, it is difficult to obtain a good quality crystalline film. Furthermore, it is difficult to obtain the large amount of variation in the thickness with high accuracy.

The present invention provides a method for manufacturing a semiconductor device including the steps of preparing a substrate having a first region, a second region, a third region, and a fourth region; forming a first layer on the substrate and a second layer on the first layer; forming a suspended mask on the substrate by etching the first layer and the second layer, the suspended mask including a shield portion having a space between the second layer and the substrate at the first region, a terrace portion being disposed apart from the shield portion at the second region, a supporting portion connecting the shield portion and the terrace portion at the third region, and an opening between the shield portion and the terrace portion at the fourth region, the shield portion extending in a first direction; and growing a semiconductor layer on a surface of the substrate in the first region and the fourth region using the suspended mask. The shield portion of the suspended mask has a width varying in the first direction, and the semiconductor layer has a thickness varying in the first direction. In accordance with the present invention, a semiconductor layer whose thickness is varied in the first direction is obtained without defects such as cross-hatch. The shield portion extending along the first direction has enough length for a spot-size converter, The first direction is used as the longer direction of a waveguide for the spat-size converter. Furthermore, the amount of variation in the thickness can be large with high accuracy.

In the method described above can include the steps of removing the suspended mask by etching the first layer using a wet etching method; forming a cladding layer on the semiconductor layer using a selective area growth mask; and forming a waveguide mesa by etching the semiconductor layer and the cladding layer. The cladding layer has a thickness varying in the first direction, and the waveguide mesa has a width varying in the first direction.

In the method described above, the step of forming, a suspended mask can include the steps of forming an insulator mask on the second layer, the insulator mask having a pattern on the first region, the second region, and the third region; etching the second layer using the insulator mask to form a first semiconductor mask composed of the second layer remaining in the first region, the second region, and the third region; selectively etching the first layer in the first region, the third region, and the fourth region by wet etching using the first semiconductor mask as an etching mask, In the method described above, the semiconductor layer is made of AlGaInAs, AlInAs, or GaInAs.

In the method described above, the first layer and the second layer are each composed of a semiconductor, In the method described above, the distance between the first region and the second region can be 18 to 100 µm.

In the method described above, the thickness of the second layer can be 3 to 8 µm.

In the method described above, the supporting portion in the third region can be formed symmetrically with respect to a center line of the shield portion in the first region.

In the method described above, the second layer in the shield portion is thinner than the second layer in the supporting portion.

In the method described above, the step of forming the suspended mask can include the steps of forming a first insulator mask on the second layer, the first insulator mask having a pattern on the first region, the second region, and the third region; etching the second layer using the first insulator mask to form a second semiconductor mask composed of the second layer remaining in the first region, the second region, and the third region; forming a second insulator mask on the second layer, the second insulator mask having a pattern covering a corner of the terrace portion; and selectively etching the first layer by wet etching using the second semiconductor mask and the second insulator mask.

In the method described above, in the step of growing the semiconductor layer, the semiconductor layer is grown by supplying a source gas onto the surface of the substrate through the opening.

The present invention provides a semiconductor device including a substrate and a semiconductor layer. The semiconductor layer includes a core layer, and is extending in a first direction. The semiconductor layer has a thickness varying in the first direction, and has a recess on a surface thereof, the recess extending in the first direction.

In the semiconductor device described above can include a cladding layer on the semiconductor layer and a waveguide mesa. The cladding layer has a thickness varying in the first direction. The waveguide mesa includes the semiconductor layer and the cladding layer.

In the semiconductor device described above, the waveguide mesa includes a spot size converter.

BRIEF DESCRIPTION OF THE DRAWINGS

FIG. 12 is a table showing the presence or absence of a cross-hatched pattern with respect to the width of the shield portion and the distance between terrace portions.

FIGS. 13A to 13C are tables showing the presence or absence of sagging of the shield portion with respect to the width and the length of the supporting portion.

FIGS. 17A to 17C are views showing a manufacturing method of a semiconductor device according to the second embodiment (part 1).

FIGS. 19A to 19C are views showing the manufacturing method of a semiconductor device according to the second embodiment (part 3).

FIGS. 20A to 20C are views showing the manufacturing method of a semiconductor device according to the second embodiment (part 4).

FIGS. 27A to 27C are views showing the manufacturing method of a semiconductor device according to the second embodiment (part 11).

FIGS. 28A to 28C are views showing the manufacturing method of a semiconductor device according to the second embodiment (part 12).

FIGS. 32A to 32C are views showing the manufacturing method of a semiconductor device according to the second embodiment (part 16).

FIGS. 40A to 40E are views showing a manufacturing method according to a fifth embodiment (part 1).

DESCRIPTION OF THE PREFERRED EMBODIMENTS

Figure 1A:
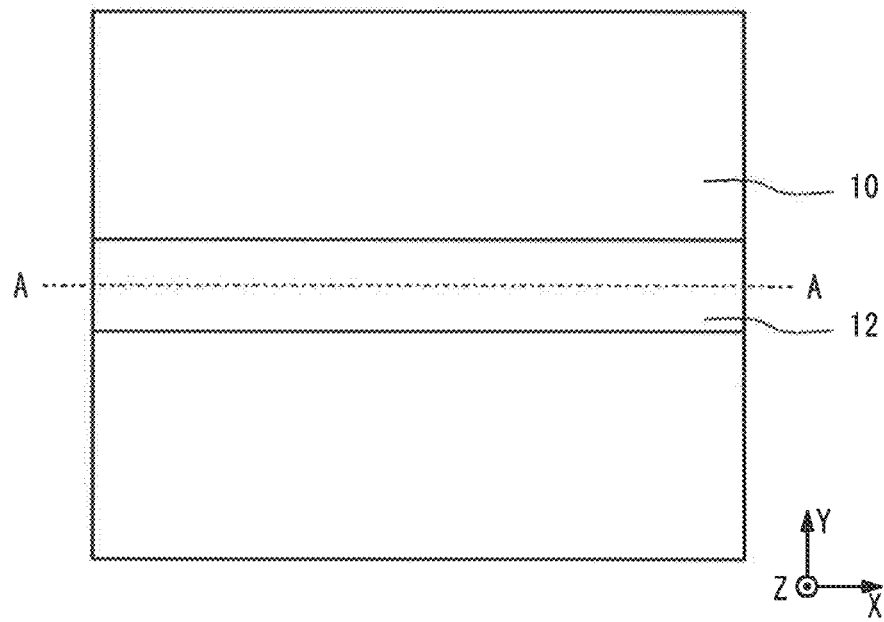
FIG. 1A is a plan view showing a semiconductor layer on a substrate.
Figure 1B:
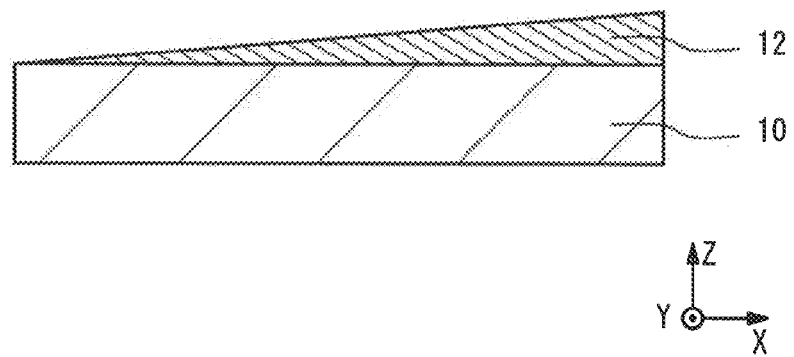
FIG. 1B is a cross-sectional view taken along the line A-A of FIG. 1A.

FIG. 1A shows a schematics of a semiconductor layer manufactured using the present invention. FIG. 1A is a plan view showing a semiconductor layer on a substrate, and FIG. 1B is a cross-sectional view taken along the line A-A of FIG. 1A. In FIG. 1A, the definition of the direction using XYZ axes is also shown. The direction in which a semiconductor layer 12 extends (a first direction) is defined as the X direction, the width direction (a second direction) is defined as the Y direction, and the direction of the normal line to a substrate 10 is defined as the Z direction. The same applies to the other drawings, In FIGS. 1A and 1B, the semiconductor layer 12 is disposed on the substrate 10. The semiconductor layer 12 has an elongated shape. The thickness of the semiconductor layer 12 is varied in the X direction. For example, the thickness of the semiconductor layer 12 increases as X increases.

Figure 2:
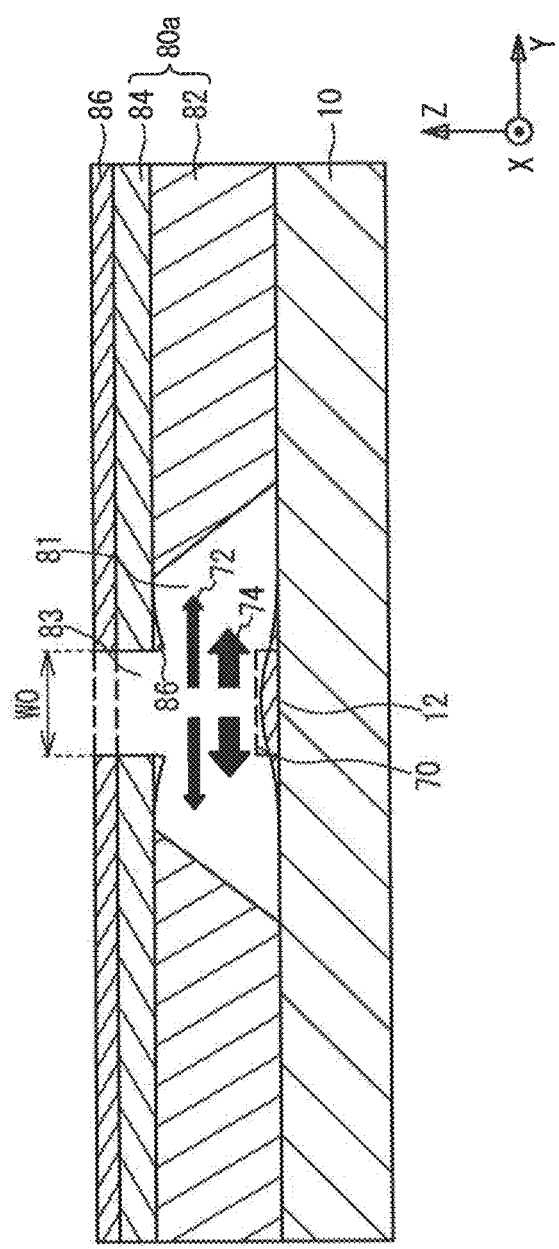
FIG. 2 is a cross-sectional view showing a process of depositing a semiconductor layer in Comparative Example 1.

FIG. 2 shows the shape of a mask 80a of Comparative Example 1. FIG. 2 is a cross-sectional view showing a process of depositing a semiconductor layer in Comparative Example 1. In this example, a mask 80a has an opening 83 in the center of the mask 80a above a substrate 10. The mask 80a has no shield portion above the substrate 10. The mask 80a includes a first layer 82 and a second layer 84 provided on the substrate 10. The first layer 82 has an space 81 formed therein. The width of the opening 83 is W0. The width of the space 81 is larger than that of the opening 83. Accordingly, the second layer 84 on the opening 81 has an eaves-like shape. A semiconductor layer 12 is deposited on the substrate 10 using the mask 80a. A metal organic vapor phase epitaxy (MOVPE) method is used for depositing the semiconductor layer 12. The semiconductor layer 12 is, for example, AlGaInAs.

When the semiconductor layer 12 is deposited, a semiconductor layer 86 is formed on the mask 80a. The semiconductor layer 86 is also deposited in the back side of the mask 80a. If the semiconductor layer 12 is formed linearly through the opening 83, the semiconductor layer 12 would have a cross-sectional shape 70. However, source gases of the semiconductor layer 12 diffuse in the ±Y directions as indicated by the arrows 72 and 74. Consequently, the semiconductor layer 12 becomes thinner than the cross-sectional shape 70. Thus, the thickness of the semiconductor layer 12 varies in the second direction.

The quality of the semiconductor layer is not uniform in the Comparative Example 1. This is because, in the MOVPE, the diffusion velocity of Al and Ga is higher than the diffusion velocity of In. The arrow 72 corresponds to the diffusion velocity of the source gases of Al and Ga, and the arrow 74 corresponds to the diffusion velocity of the source gas of In. Consequently, at both ends in the r direction of the semiconductor layer 12, the composition of the semiconductor layer 12 differs from the target. This may result in occurrence of a cross-hatched pattern in the semiconductor layer 12. The region where the cross-hatched patter exists in Comparative Example 1 is not suitable for a waveguide, As the source gas of Al, trimethylaluminum (TMA) or triethylaluminum (TEA) may he used. As the source gas of Ga, trimethylgallium (TMG or triethygallium (TEG) may be used. As the source gas of in, trimethylindium (TMI) or triethylindium (TEI) may be used.

Figure 3:
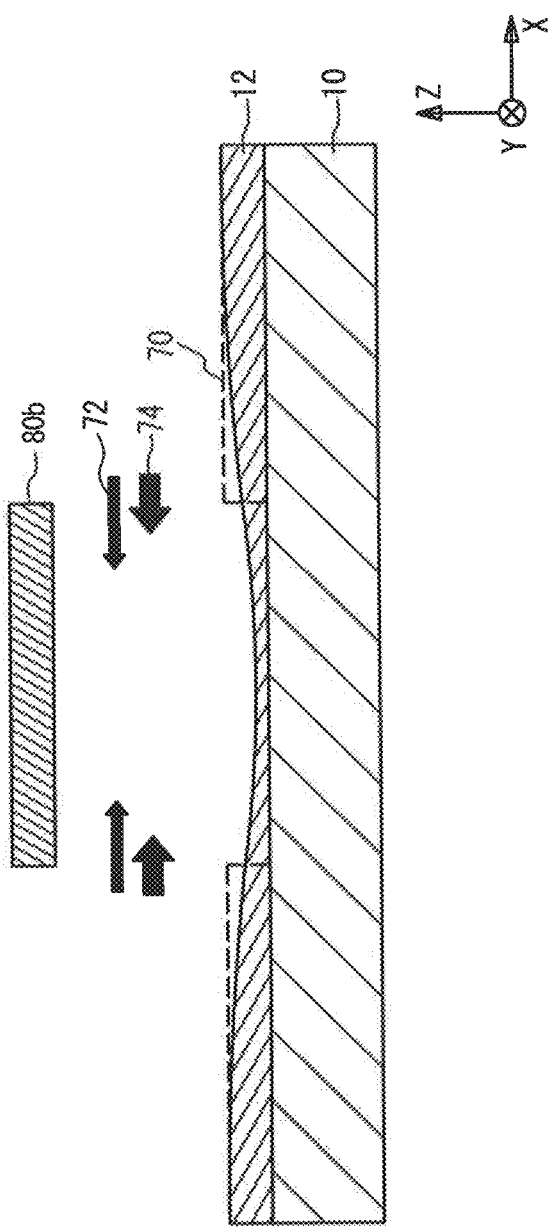
FIG. 3 is a cross-sectional view showing a process of depositing a semiconductor layer in Comparative Example 2.

FIG. 3 shows the shape of a mask 80b of Comparative Example 2. FIG. 3 is a cross-sectional view showing a process of depositing a semiconductor layer in Comparative Example 2. In this example, the mask 80b has a shield portion and has no supporting portion or terrace portion which is different from the mask 80 of the present invention, The mask 80b is arranged above a substrate 10. The distance between the mask 80b and the substrate 10 is 50 μm or more. A semiconductor layer 12 is formed on the substrate 10 below the mask 80b. The thickness of the semiconductor layer 12 below the mask 80b is smaller than the thickness of the semiconductor layer 12 in the other region. By changing the width of the mask 80b in the X direction, the thickness of the semiconductor layer 12 can be varied in the X direction. The quality of crystalline film can be more uniform compared with Comparative Example 1, since the source gases are supplied from both sides of the mask 80b. However, the thickness variation in the first direction is small since the source gases are supplied from both sides of the mask 80b In Comparative Examples 1 and 2, the thickness of the semiconductor layer 12 can be varied. However, these techniques is not suitable for varying the thickness of the semiconductor layer 12 in the first direction. In order to vary the thickness in the first direction, the width in the X direction of the mask 80a or 80b may be increased, These reduce the accuracy of the thickness.

Figure 4:
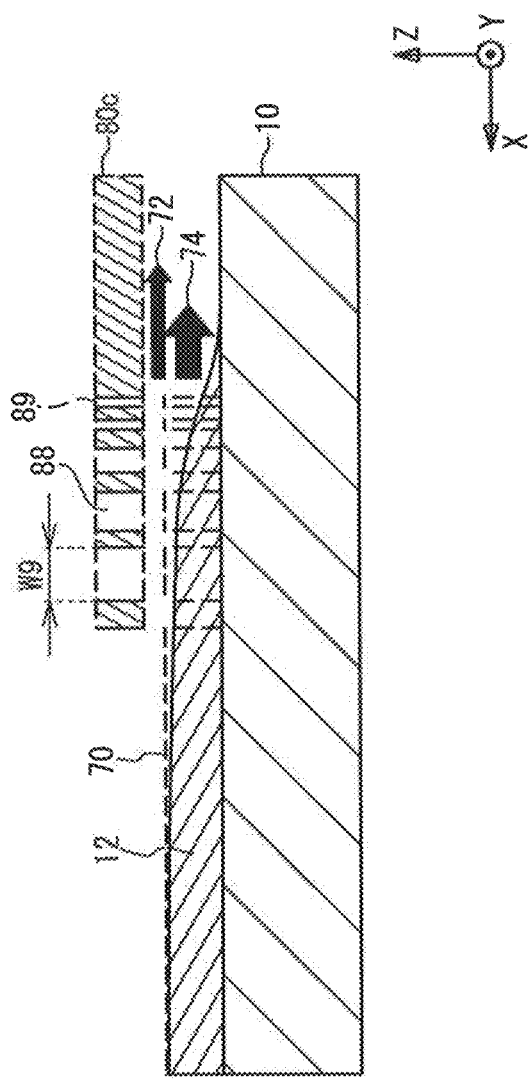
FIG. 4 is a cross-sectional view showing a process of depositing a semiconductor layer in Comparative Example 3.

FIG. 4 shows the shape of a mask 80c of Comparative Example 3, FIG. 4 is a cross-sectional view showing a process of forming a semiconductor layer in Comparative Example 3. A mask 80c is provided with a plurality of slits 88. By decreasing the slit width W9 in the X direction, the thickness of the semiconductor layer 12 decreases in the X direction. Source gases are supplied on the substrate 10 through the slits 88.

On the positive side of the position 89 in the X direction, there is no slit 88. And in that region, as indicated by the arrows 72 and 74, the source gases are supplied from one direction only. As a result, the quality of the semiconductor layer 12 is not made uniform owing to a difference in diffusion velocity between the source gases.

As is obvious from Comparative Examples 1 to 3, it is difficult to form a semiconductor layer 12 whose thickness is varied in the first direction with good quality (e.g., without forming a cross-hatched pattern) and with high accuracy in thickness.

First Embodiment

Figure 5A:
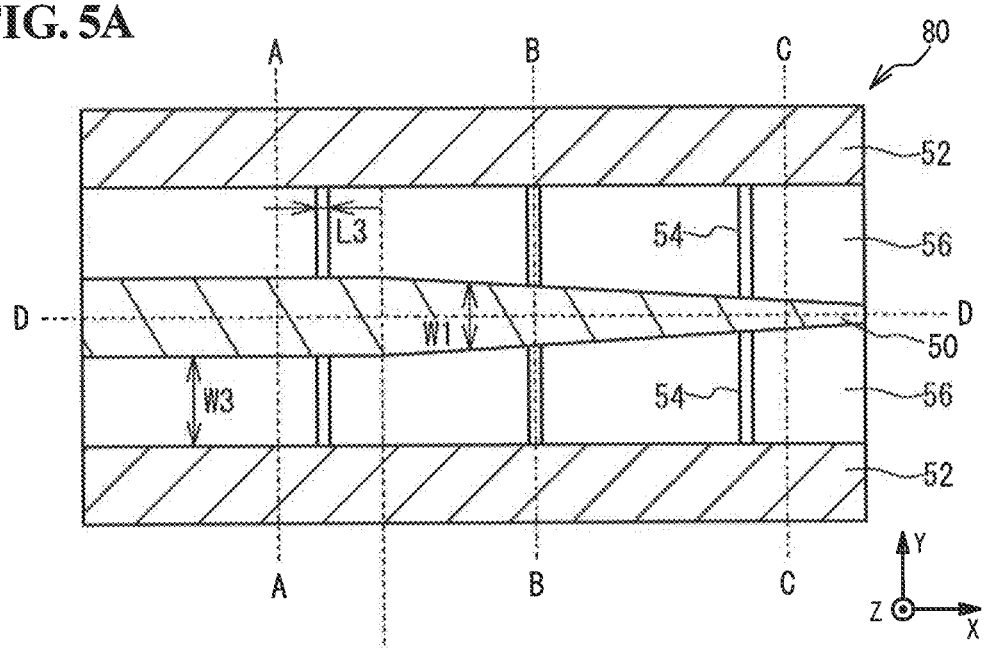
FIG. 5A is a plan view showing an example of a suspended mask according to a first embodiment.
Figure 5B:
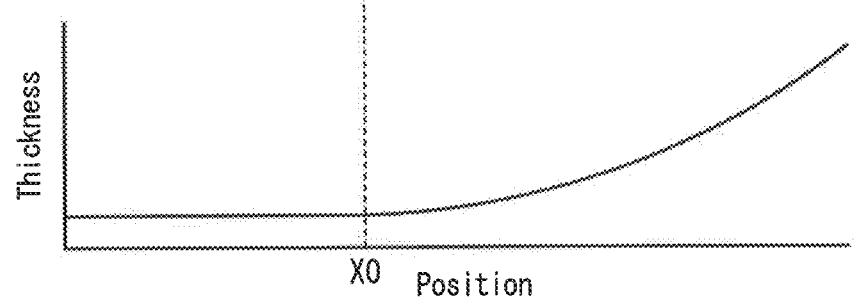
FIG. 5B is a graph showing the relationship between the thickness T1 of the semiconductor layer and the position X along the line D-D of FIG. 5A.
Figure 6A:
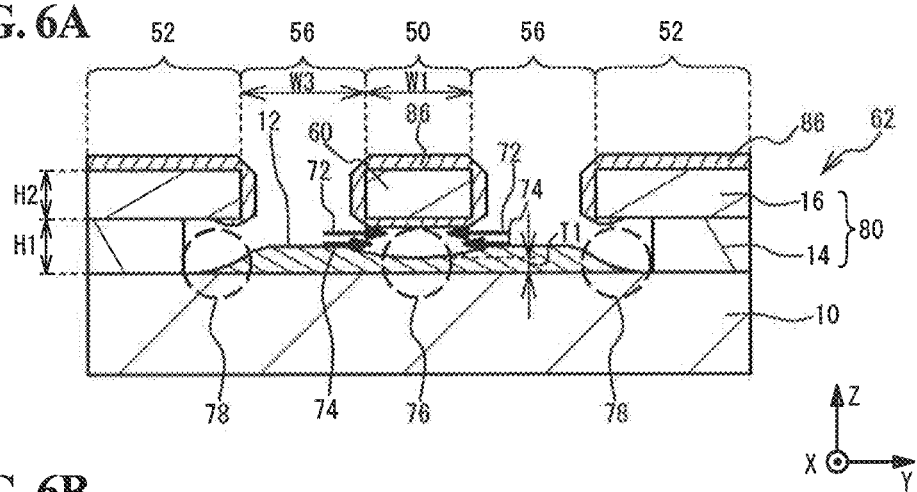
FIGS. 6A to 6C are a cross-sectional view taken along the line A-A of FIG. 5A, a cross-sectional view taken along the line BB of FIG. 5A, and a cross-sectional view taken along the line C-C of FIG. 5A, respectively.
Figure 6B:
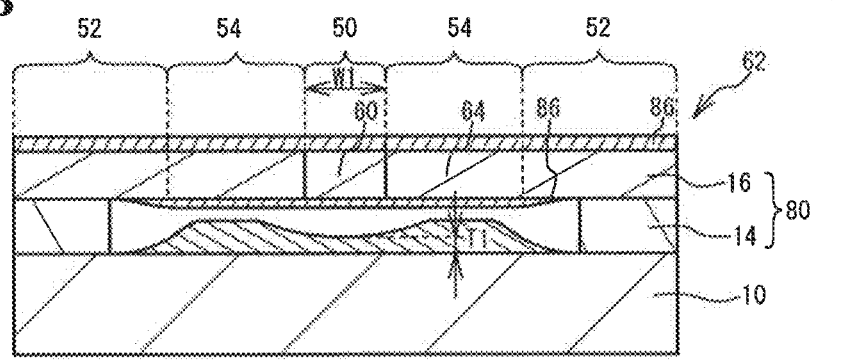
Figure 6C:
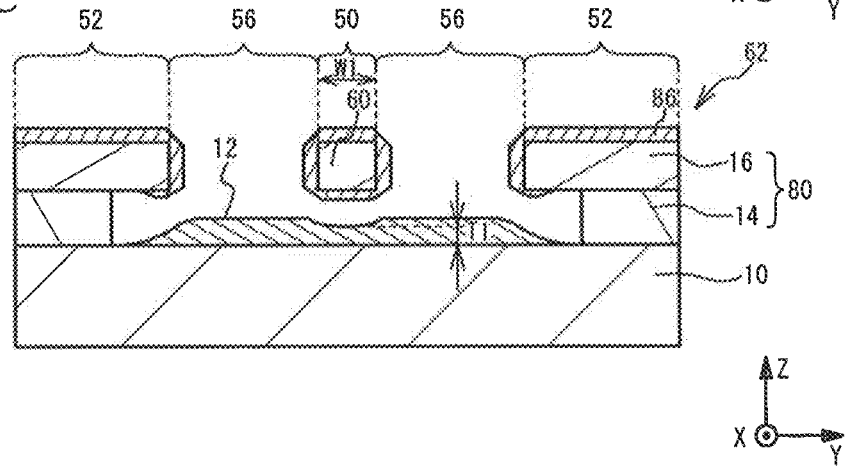

FIG. 5A is a plan view of a suspended mask 80 of the first embodiment in the present invention. FIG. 5B is a graph showing the relationship between the thickness T1 of the semiconductor layer formed using the suspended mask 80 and the position X. The thickness is taken along the line D-D of FIG. 5A. FIGS. 6A to 6C are a cross-sectional view taken along the line A-A of FIG. 5A, a cross-sectional view taken along the line BB of FIG. 5A, and a cross-sectional view taken along the line C-C of FIG. 5A, respectively, Referring to FIG. 5A, the suspended mask 80 is formed in a first region 50, a second region 52, a third region 54 and a fourth region 56. Referring to FIGS. 6A to 6C, the suspended mask 80 includes a first layer 14 and a second layer 16.

As shown in FIG. 5A, the first region 50 extends in the X direction, and the width W1 in the Y direction is changed along the X direction. The X direction corresponds to the first direction, and the Y direction corresponds to the second direction. In a region in which X is smaller than the position X0, the width W1 is substantially constant. In a region in which X is larger than the position X0, the width W1 gradually decreases. The second regions 52 are provided for both side of the first region 50. The second region 52 and the first region 50 are separated from each other. The third region 54 connects the first region 50 and the second region 52. The fourth region 56 is located between the first region 50 and the second region 52.

As shown in FIGS. 6A to 6C, the second layer 16 is disposed above the substrate 10 in the first region 50. The second layer 16 serves as a shield portion 60 in the first region 50. In the first region 50, the shield portion 60 has a space between the second layer 16 and the substrate 10. The first layer 14 and the second layer 16 are disposed in the second region 52. The first layer 14 and the second layer 16 serve as terrace portions 62. As shown in FIG. 6A, the second region 52 has an eaves-like shape formed by the second layer 16 over a region 78. Referring to FIG. 6B, the second layer 16 is disposed above the substrate 10 in the third region 54. The second layer 16 in the third region 54 serves as a supporting portion 64. The supporting portion 64 connects the shield portion 60 and the terrace portion 62. The third region 54 is extending in the Y direction. In the third region 54, the supporting portion 64 has a space between the second layer 16 and the substrate 10, The length L3 of the third region 54 in the X direction is sufficiently smaller than the width W1 of the first region 50. Consequently, in the process of deposition, flows of source gases are not blocked by the supporting portion 64 in the third region 54. In the fourth region 56, the second layer 16 is not provided above the substrate 10. The fourth region 56 serves as openings of the suspended mask 80.

The deposition method of the semiconductor layer 12 is, for example, an MONTE method. The semiconductor layer 12 is, for example, composed of AlGaInAs. The shield portion 60 is provided above the substrate 10 in the first region 50 (region 76), Source gases are provided to region 76 only through the opening in the fourth region 56. The source gases are diffused in the Y direction on the substrate 10 and reach to the region 76. Therefore, the thickness T1 of the semiconductor layer 12 below the shield portion 60 becomes small. The diffusion of source gases are indicted by the arrows 72 and 74 in FIG. 6A. The diffusion velocity of the source gas of In (arrow 74) differs from those of the source gases of Ga and Al (arrow 72). These source gases can sufficiently spread in the region 76, because the openings are provided on both side of the shield portion 60. Therefore, the composition of the semiconductor layer 12 is uniform. Consequently, a cross-hatched pattern is unlikely to occur. Thus the semiconductor layer 12 in the region 76 is preferable for a waveguide mesa. On the other hand, below the eves-like second layer 16 (region 78) of the terrace portion 62, source gases are diffused from either one of the +Y direction and the −Y direction, Accordingly, the composition is likely to become nose-uniform because of a difference in diffusion velocity between the source gas of In and the source gases of Ga and Al. The non-uniform composition causes roughening of the film surface, such as a cross-hatched pattern. The semiconductor layer in the region 78 is not preferable to a waveguide mesa. But the region 78 is apart from the region 76, and the semiconductor layer 12 in the region 78 can be removed by an etching during in a fabrication step of the waveguide mesa.

In the cross section of FIG. 6B, the width W1 of the first region 50 is smaller than the width W1 in FIG. 6A. The supply of the source gases below the shield portion 60 becomes larger, as the width W1 becomes smaller. Thus the thickness T1 in FIG. 6B is larger than the thickness T1 in FIG. 6A. The cross section of FIG. 6B shows the third region 54 (supporting portion 64). Since the length L3 in FIG. 5A of the third region 54 (supporting portion 64) is sufficiently small, the source gases is not blocked by the supporting portion 64. A influence of the supporting portion 64 on the thickness of the semiconductor layer 12 is negligible. In the cross section of FIG. 6C, the width W1 of the first region 50 is smaller than that in FIG. 6B. Thus, the thickness T1 is larger than that in FIG. 6B.

FIG. 5B is a graph showing the relationship between the thickness T1 of the semiconductor layer 12 and the position in the X direction. As shown in FIG. 5B, the thickness T1 is constant when X is smaller than X0. The thickness increases as X increases. This corresponds to the change in the width W1.

The relationship between the quality of the semiconductor layer 12 and the parameters of the mask 80a (Comparative Example) was examined. The cross-section of the mask 80a is shown in FIG. 2. The thickness and material of each layer in the mask 80a are as follows:
First layer 82: $Al_{0.52}In_{0.48}As$, thickness: H0
Second layer 84: InP, thickness: 1 μm
The mask 80a has an opening 83, width: W0

Figure 7:
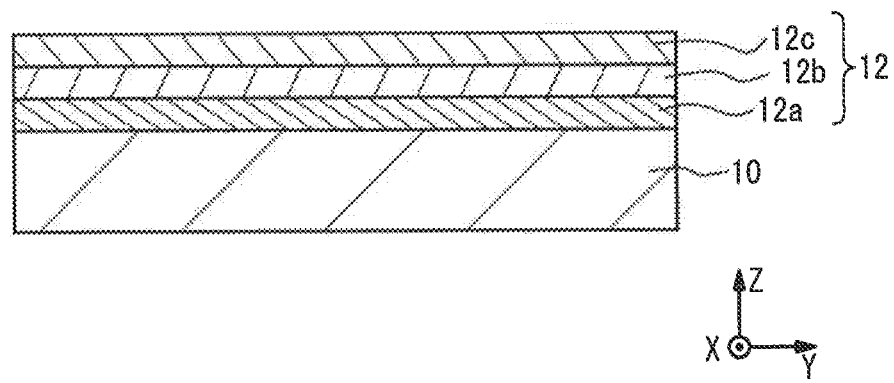
FIG. 7 is a cross-sectional view of a semiconductor layer formed on a substrate.
Figure 8:
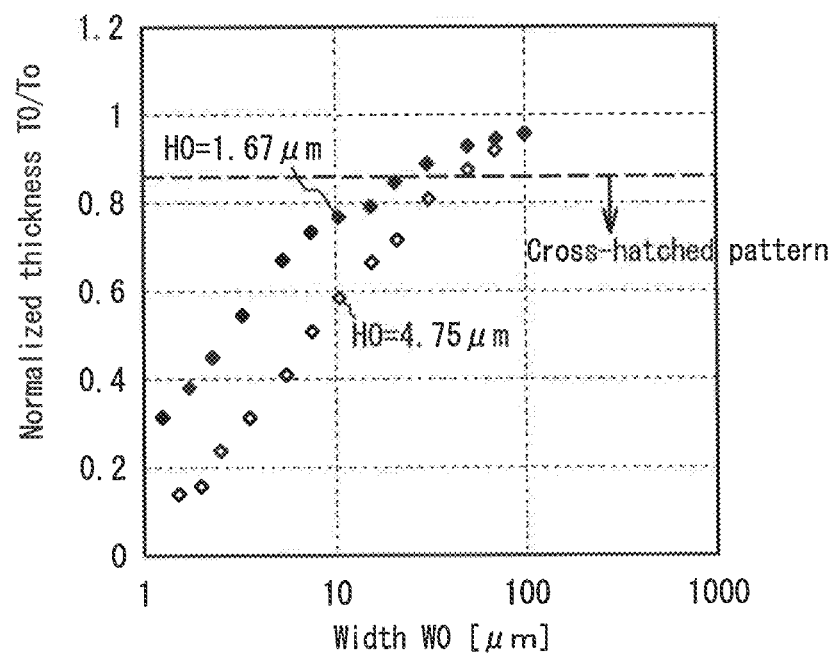
FIG. 8 is a graph showing the relationship between the width W0 of an opening of a mask and the normalized thickness in Comparative Example 1.

FIG. 7 is a cross-sectional view of a semiconductor layer 12 formed on a flat substrate without using the mask 80a. In the semiconductor layer 12, buffer layer 12a, a core layer 12b, and a cap layer 12c were formed in that order on a substrate 10. The thickness and material of each layer are as follows:
Buffer layer 12a: InP, thickness: 20 nm
Core layer 12b: AlGaInAs multi-quantum well (MQW) layer, thickness: 400 nm
Cap layer 12c: InP, thickness: 400 nm FIG. 8 is a graph showing the relationship between the width W0 of the opening 83 and the normalized thickness "T0/To" of the core layer 12b in Comparative Example 1. "To" is the thickness of the core layer 12b formed on the substrate 10 without using the mask 80a. "T0" is the thickness of the semiconductor layer 12 formed below the opening 83 using the mask 80a, The normalized thickness is defined as the value obtaining by dividing "T0" by "To", In FIG. 8, the normalized thickness is plotted in cases of the thickness of the first layer 82 (H0) is 1.67 μm or 4.75 μm. Referring to FIG. 8, when the the width W0 decreases, the normalized thickness decreases. Furthermore, at a larger thickness H0, the normalized thickness is smaller. A cross-hatched pattern appears when the normalized thickness is smaller than 0.85 in Comparative Example 1.

Figure 9A:
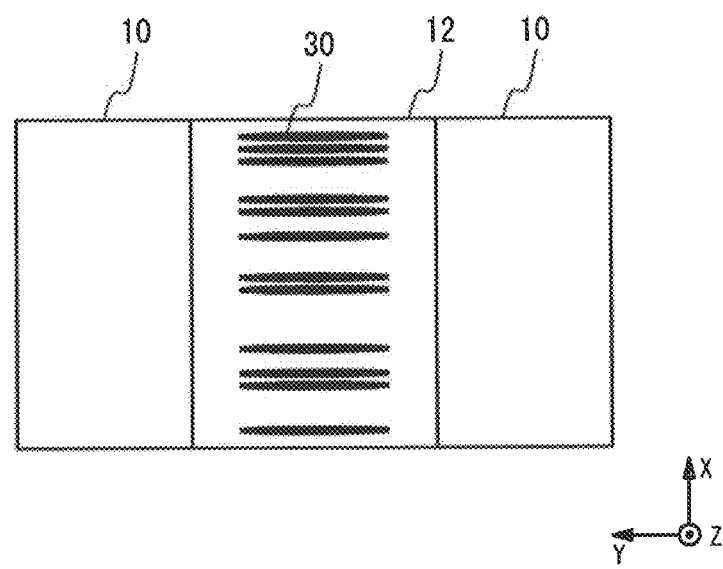
FIGS. 9A and 9B are schematic diagrams showing photographs of surfaces in Comparative Example 1 and the first embodiment.
Figure 9B:
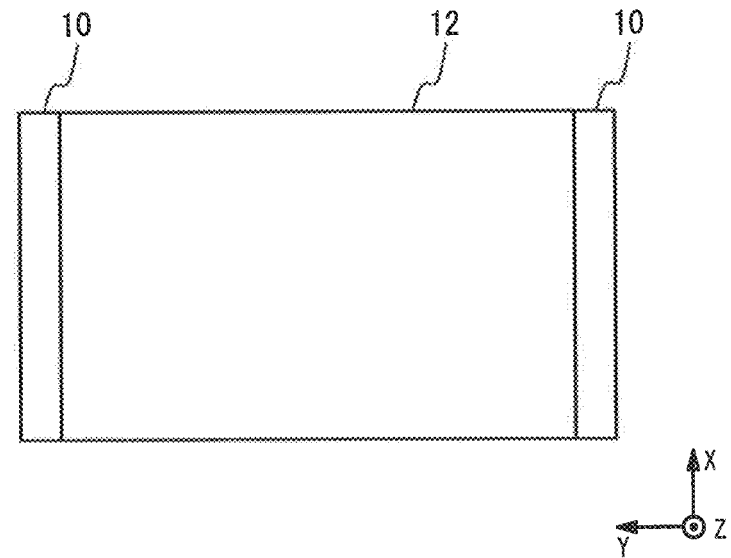

The cross-hatched pattern is an indicator of the bad quality of the semiconductor layer. FIGS. 9A and 9B are schematic diagrams of the surface of the semiconductor layer 12 observed using an optical microscope, The observation of the surface was performed after the mask 80a was removed, FIG. 9A shows an example of the surface in Comparative Example 1 where a cross-hatched pattern appeared. FIG. 9B shows an example of the surface in the first embodiment where a cross-hatched pattern did not appeared. As shown in FIGS. 9A and 9B, the quality of the semiconductor layer 12 in the first embodiment is better than that in Comparative Example 1.

Figure 10:
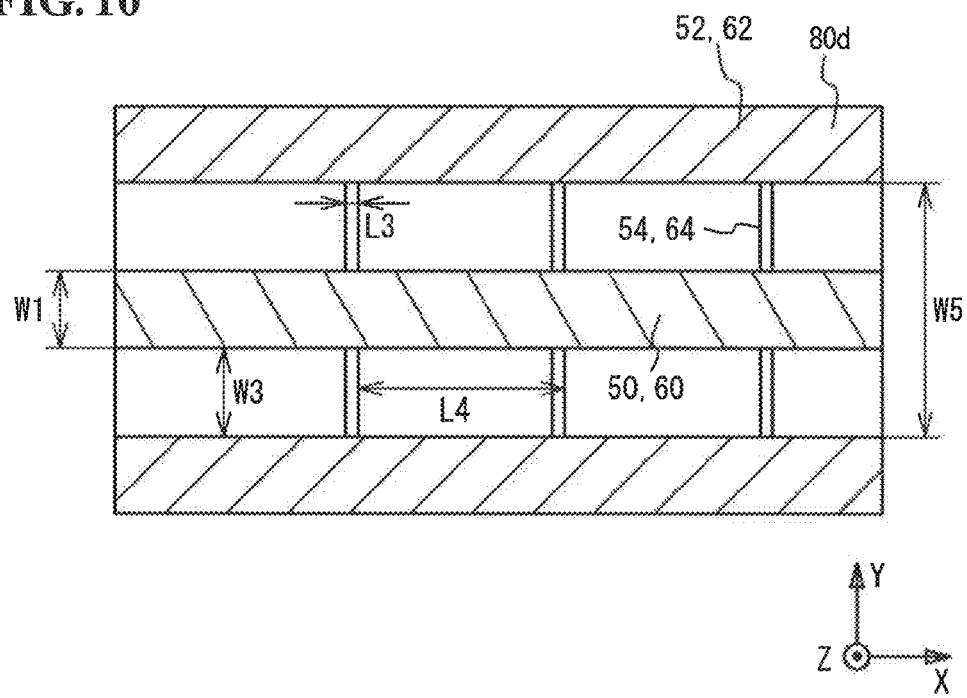
FIG. 10 is a plan view of a mask.

An experiment is carried out in order to obtain the optimum design of the mask 80 in the first embodiment, FIG. 10 shows the plan view of a suspended mask 80d used in the experiment. The width W1 of the first region 50 (shield portion 60) is constant along the X direction, The width W1 is changed from 1 μm to 20 μm in every experiment. The width in the Y direction of the third region 54 (supporting portion 64) is W3, the length in the X direction is L3, and the pitch in the X direction of the third region 54 is L4. The distance in the Y direction between second regions 52 (terrace portions 62) is W5, in which W5=2×W3+W1. The distance W5 is changed from 50 pm to 140 μm in every experiment.

The material and thickness of each layer in the suspended mask 80d are as follows:
First layer 14: $Al_{0.52}In_{0.48}As$, thickness: 1.67 μm
Second layer 16: InP, thickness: 6 μm
The structure of a semiconductor layer 12 formed on a flat substrate without using the suspended mask 80d is as follows:
Buffer layer 12a: InP, thickness: 20 nm
Core layer 12b: AlGaInAs multi-quantum well (MQW) layer, thickness: 400 nm
Cap layer 12c: InP, thickness: 400 nm
The method of forming the suspended mask 80d is the same as that in a second embodiment which will be described later.

Figure 11:
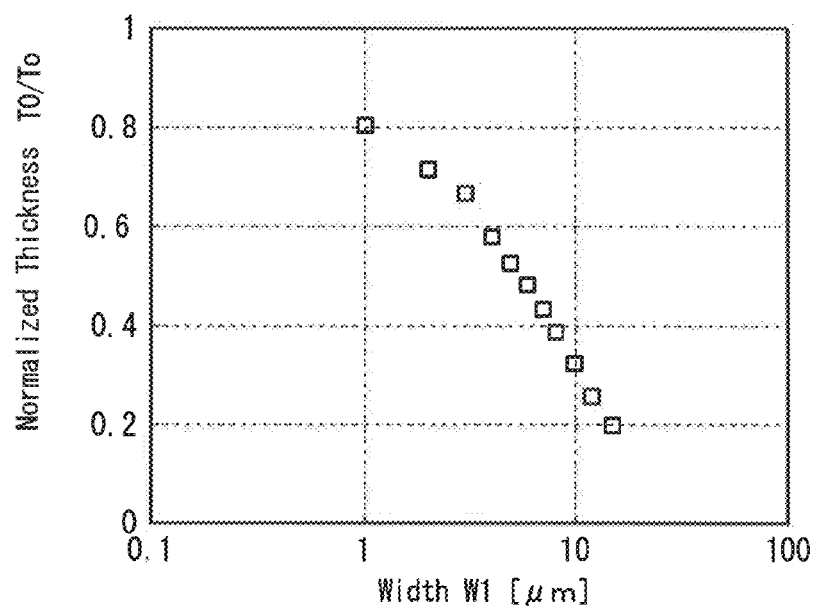
FIG. 11 is a graph showing the relationship between the width W1 of a shield portion and the normalized thickness in the first embodiment.

FIG. 11 is a graph showing the relationship between the width W1 and the normalized thickness T0/To of the core layer 12b. The definition of the normalized thickness T0/To is the same as that described with reference to FIG. 8. Referring to FIG. 11, as the width W1 decreases, the normalized thickness T0/To increases.

FIG. 12 is a table showing the presence or absence of a cross-hatched pattern with respect to the width W1 of the shield portion 60 and the distance W5 between terrace portions 62. The circle "○" indicates that no cross-hatched pattern is observed on the surface, and the cross mark "x" indicates that a cross-hatched pattern is observed on the surface. A cross-hatched pattern was observed when W5=50 μm and W1=15 μm or W1=20 μm. Under other conditions, no cross-hatched pattern was observed.

As described above, when the distance W5 decreases, a cross-hatched pattern is formed in the semiconductor layer 12. The distance W5 is proportional to the width between the shield portion 60 and the terrace portion 62 (W3). Therefore, in order to prevent formation of a cross-hatched pattern in the semiconductor layer 12, it is preferable to increase the width W3. In the case of FIG. 12, the width W3 is preferably 18 µm or more. The distance is more preferably 20 µm or more, and still more preferably 30 µm or more.

FIGS. 13A to 13C are tables showing the presence or absence of sagging of the shield portion 60 with respect to the width W3 and the length L3 of the supporting portion 64. The expression "sagging of the shield portion 60" refers to displacement of the shield portion 60 by its own weight in the −Z direction (toward the substrate), FIG. 13A shows the presence or absence of sagging when W1 is 15 µm and L4 is 50 µm. The presence or absence of sagging was observed using a microscope. The width W1 is determined for achieving a normalized thickness of the core layer 12b of 0.2 or less. The circle "○" indicates the absence of sagging, and the cross mark "x" indicates the presence of sagging. When the length L3 of the supporting portion 64 is 1 µm, sagging occurs at a width W3 of 62 µm or more. When the length L3 is 1.5 µm, sagging occurs at a width W3 of 73 µm or more. When the length L3 is 2 µm, a width W3 of 91 µm or more results in "x". As the width W3 in the Y direction of the supporting portion 64 increases, sagging is more likely to occur. As the length L3 of the supporting portion 64 decreases, sagging is more likely to occur, There is a hollow space under the shield portion 60. The sagging occurs when the supporting portion 64 is excessively long and the supporting of the shield portion 60 becomes insufficient.

FIG. 13B shows the results of observation of sagging of the shield portion 60 when the pitch L4 in the X direction of the supporting portion 64 is set at 150 µm. The width W1 in the Y direction of the shield portion 60 is 15 µm. When the length L3 of the supporting portion 64 is 1 µm, 1.5 µm, and 2 µm, width W3 of the supporting portion 64 of 42 µm or more, 50 µm or more, and 62 µm or more, respectively, results in "x".

FIG. 13C shows the results when the width W1 of the shield portion 60 is 10 µm. The width W1 of 10 µm is the width required for achieving a normalized thickness of the core layer 12b of 0.33. As shown in FIG. 13C, when the length L3 of the supporting portion 64 is 1 µm, 1.5 µm, and 2 µm, a width W3 of the supporting portion 64 of 93 µm or more, 110 µm or more, and 137 µm or more, respectively, results in "x".

The shield portion 60 is supported by the terrace portion 62 via the supporting portion 64. There is a space under the shield portion 60 and supporting portion 64. Accordingly, when the width W1 of the shield portion 60 is increased, the shield portion 60 sags because of gravity and the like. Furthermore, when the length L3 of the supporting portion 64 is decreased, the shield portion 60 also sags because of gravity and the like. When the width W3 of the supporting portion 64 is increased, the shield portion 60 also sags because of gravity and the like. As shown in FIG. 13B, when the pitch L4 of the supporting portion 64 is increased, the shield portion 60 is also likely to sag. On the other hand, in order to improve uniformity in thickness of the semiconductor layer 12, a larger pitch L4 is preferable. The reason for this is that in the process of forming the semiconductor layer 12, source gases can reach the area below the supporting portion 64. Furthermore, when the width W3 of the supporting portion 64 is increased, the shield portion 60 is likely to sag. Accordingly, it is not preferable to excessively increase the width W3 of the supporting portion 64. Therefore, the width W3 is preferably 100 µm or less, more preferably 80 µm or less, and still more preferably 60 µm or less.

When the thickness of the second layer 16 is decreased, the shield portion 60 has a sheet-like shape, and therefore, sagging is likely to occur. Therefore, when the second layer 16 is thin, it is not possible to increase the width W3 of the supporting portion 64. Thus, as shown in FIG. 12, a cross-hatched pattern is likely to occur in the semiconductor layer 12. When the width W1 of the shield portion 60 is decreased, as shown in FIG. 13C, sagging is unlikely to occur. However, when the width W1 is small, as shown in FIG. 11, it is not possible to decrease the normalized thickness of the semiconductor layer 12. That is, the range in which the thickness of the semiconductor layer 12 can be varied is narrowed. Therefore, the thickness of the second layer 16 is preferably 3 µm or more, and more preferably 4 µm or more. When the thickness of the second layer 16 is increased, it becomes difficult to etch the second layer 16. Therefore, the thickness of the second layer 16 is preferably 8 µm or less, and more preferably 7 µm or less.

Furthermore, a plurality of supporting portions 64 (third regions 54) are provided on one side of the shield portion 60 (first region 50). Accordingly, it is possible to suppress sagging of the shield portion 60.

Examples of variation in the suspended mask will he described below.

Figure 14A:
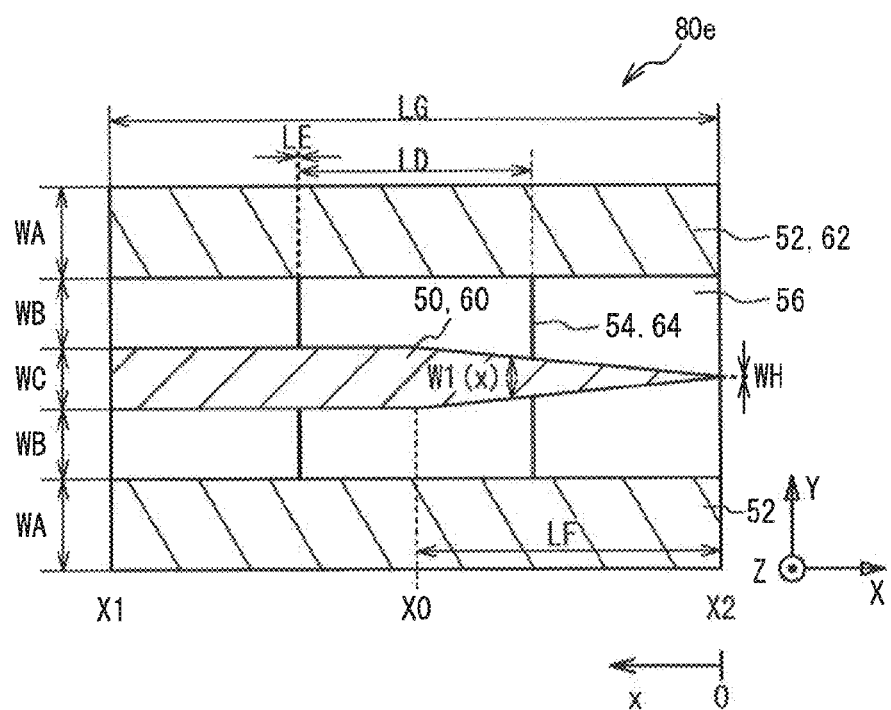
FIG. 14A is a plan view showing an example of a suspended mask.
Figure 14B:
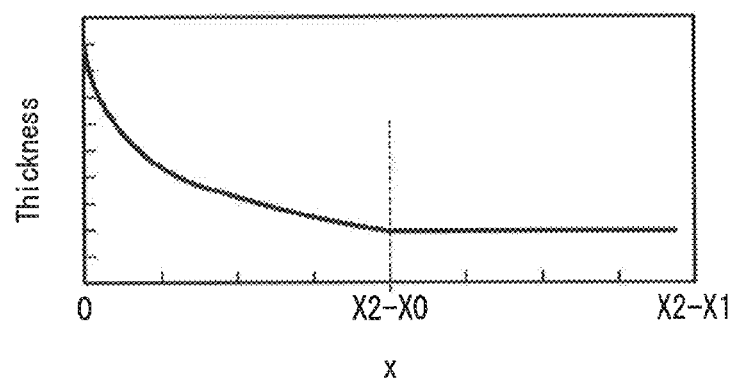
FIG. 14B is a graph showing a change in the thickness of the semiconductor layer with respect to x.

FIG. 14A is a plan view showing an example of the suspended mask 80e. FIG. 14B is a graph showing the thickness of the semiconductor layer 12 just below the centerline of the shield portion 60 in the X direction. Referring to FIG. 14A, the suspended mask 80e is provided between X1 and X2 in the X direction. The width W1 of the shield portion 60 (first region 50) is constant when the X is larger than X0. This constant width is denoted by WC. The width W1 gradually decreases as the X becomes smaller than X0. The width W1 at the position X2 is denoted by WH. The width of the terrace portion 62 (second region 52) is denoted by WA. The width of the fourth region 56 (between the shield portion 60 and the terrace portion 62) is denoted by WB. The distance between X1 and X2 is denoted by LG, and the distance between X0 and X2 is denoted by LF. The length in the X direction of the supporting portion 64 is denoted by LE, and the pitch in the X direction between supporting portions 64 is denoted by LD.

The position X2 in FIG. 14A corresponds to x=0 in FIG. 14B. The left side of the position X2 in FIG. 14A corresponds to the positive x direction in FIG. 14B. In the case where the width W1(x) of the first region 50 changes linearly with respect to x, W1(x) is expressed by the following formula:

$$W1(x)=WH+(WC-WH)\times x/LF$$

Referring to FIG. 14B, in the region from x=0 to x=X2−X0, the thickness of the semiconductor layer 12 decreases exponentially. In the region in which x is X2−X0 or more, the thickness is constant. That is, when the width W1 of the shield portion 60 is constant, the thickness is also constant.

Figure 15A:
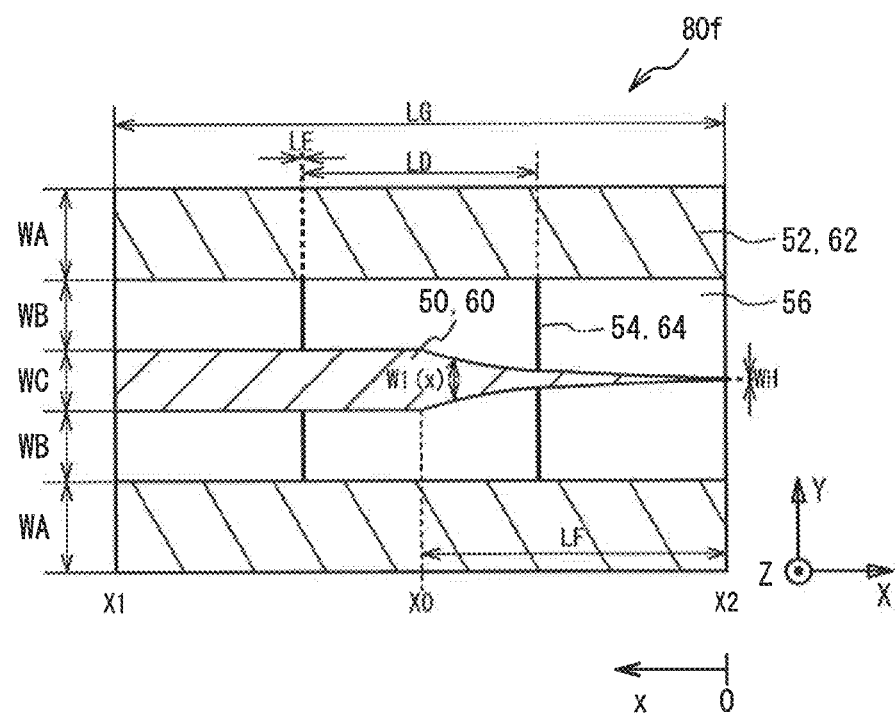
FIG. 15A is a plan view showing another example of a suspended mask.
Figure 15B:
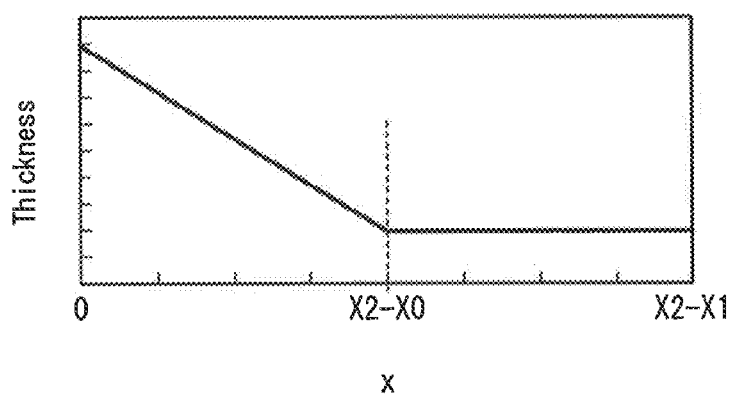
FIG. 15B is a graph showing a change in the thickness of the semiconductor layer with respect to x.

FIG. 15A is a plan view showing another example of the suspended mask 80f FIG. 15B is a graph showing the thickness of the semiconductor layer with respect to x. In the example of FIG. 15A, the width W1(x) of the first region 50 changes exponentially with respect to x. The width W1(z) is expressed by the following formula:

$$W1(x)=WH\times\exp(X/LF\times\mathrm{Log}(WC/WH))$$

As shown in FIG. 15B, the thickness of the semiconductor layer 12 decreases linearly from x=0 to x=X2−X0.

As shown in FIGS. 14A to 15B, by varying the width W1(x) of the shield portion 60 (first region 50) in the X direction, the thickness of the semiconductor layer 12 can be arbitrarily varied in the X direction. By selecting a variable function of the width W1 of the shield portion 60, the thickness can be varied linearly or the thickness can be varied exponentially, For example, the widths and lengths can be set as follows: WA=40 µm, WB=27.5 µm, WC=15 µm, LD=150 µm, LE=1 µm, LF=200 µm, LG=301 µm, and WH=1 µm. Preferably, the width WA is set such that the minimum width in the Y direction of the first layer 14 is 3 µm or more (½ of the thickness of the second layer 16 of the suspended mask 80) when the first layer 14 is etched. In order to reduce the composition distribution of the semiconductor layer 12 due to vapor-phase diffusion of source gases, WB is preferably 20 µm or more, and more preferably 30 µm or more. LD is preferably 30 µm or more, and more preferably 50 µm or more. In order to reduce the composition distribution of the semiconductor layer 12 by the third region 54, LE is preferably 3 µm or less, and more preferably 2 µm or less. Preferably, LE/LD≤0.1, and more preferably, LE/LD≤0.05.

In accordance with the first embodiment, using the suspended mask 80, the semiconductor layer 12 is grown on the substrate 10. As shown in FIG. 5B, the thickness of the semiconductor layer 12 is varied in the first direction. The thickness of the semiconductor layer is controlled by changing the width of the shield portion 60. When the width of the shield portion is monotonically changed in the first direction, the thickness of the semiconductor layer is monotonically varied in the first direction. In addition, the quality of the semiconductor layer 12 is made uniform. Furthermore, the second layer 16 is formed on the first layer 14 and used as the suspended mask 80. This facilitates the control of the thickness.

The third region 54 is arranged symmetrically with respect to a longer axis of the first region 50. Accordingly, the semiconductor layer 12 can be formed symmetrically with respect to the longer axis.

In the semiconductor layer 12 manufactured in accordance with the first embodiment, as shown in FIGS. 6A to 6C, the thickness of the central portion is smaller than that of the side portion. The amount of recess of the surface of the semiconductor layer 12 increases as the thickness T1 of the semiconductor layer 12 decreases.

Furthermore, the semiconductor layer 12 includes an InP butler layer 12a disposed on the substrate 10, a core layer 12b containing AlGaInAs or AlInAs disposed on the buffer layer 12a, and an InP cap layer 12c disposed on the core layer 12h. Regarding the semiconductor layer 12 containing AlGaInAs or AlInAs, the thickness is varied while maintaining good quality of crystalline film.

In the first embodiment, for example, the following material can also be used.
Uppermost layer of substrate 10: InP
First layer 14: AlInAs, GaInAs, or AlGaInAs
Second layer 16: InP
Buffer layer 12a: InP
Core layer 12b: InGaAsP MQW layer
Cap layer 12c: InP
The method of forming the suspended mask 80 is the same as that in the second embodiment which will be described later. However, a different etching solution from that in the second embodiment is used depending on the materials of the first layer 14 and the second layer 16.
Etching solution for first layer 14: sulfuric acid: aqueous hydrogen peroxide: water=1:1:1
Furthermore, the following materials can also be used.
Uppermost layer of substrate 10: InGaAsP
First layer 14: InP
Second layer 16: InGaAsP or GaInAs
Buffer layer 12a: InP or InGaAsP
Core layer 12b: InGaAsP MQW layer
Cap layer 12c: InGaAsP
Etching solution for first layer 14: hydrochloric acid: water=1:1
Furthermore, the following materials can also be used.
Uppermost layer of substrate 10: GaInAsP
First layer 14: InP
Second layer 16: InGaAsP
Buffer layer 12a: InP or InGaAsP
Core layer 12b: AlGaInAs MQW layer
Cap layer 12c: AlGaInAs or InGaAsP
Etching solution for first layer 14: hydrochloric acid: water=1:1.

In the case where the materials described above are used, a source gas of In and a source gas of Al are simultaneously used when the buffer layer 12a, the core layer 12b, and the cap layer 12c are deposited. These source gases have different diffusion velocities. However, when the suspended mask 80 of the first embodiment is used, even if source gases have different diffusion velocities, it is possible to avoid formation of a cross-hatched pattern due to the non-uniform composition. Similarly, a source gas of In and a source gas of Ga have different diffusion velocities, but use of the first embodiment is effective, For example, in the first embodiment, the semiconductor layer 12 may contain AlGaInAs, AlInAs, or GaInAs. The structure of the semiconductor layer 12 is not limited to that described above. For example, when the semiconductor layer 12 contains a plurality of elements, during formation of the semiconductor layer 12, the elements may have different diffusion velocities in some cases, Therefore, use of the suspended mask 80 of the first embodiment is effective. Furthermore, for the first layer 14, the second layer 16, the buffer layer 12a, the core layer 12b, and the cap layer 12c, a combination of materials which are epitaxially grown on one another is preferable.

As the etchant for the first layer 14, a solution by which the first layer 14 is etched and the outermost surface of the substrate 10 and the second layer 16 are unlikely to be etched is preferable. For example, in the case where the outermost surface of the substrate 10 and the first layer 14 contain InP and the second layer 16 contains As, as the etchant for the first layer 14, a sulfuric acid-based solution containing hydrogen peroxide or a hydrochloric acid-based solution containing hydrogen peroxide can be used. In the case where the outermost surface of the substrate 10 and the first layer 14 contain As and the second layer 16 is composed of InP, a hydrochloric acid-based solution which does not contain hydrogen peroxide or a bromine-based solution can be used.

Second Embodiment

Figure 16:
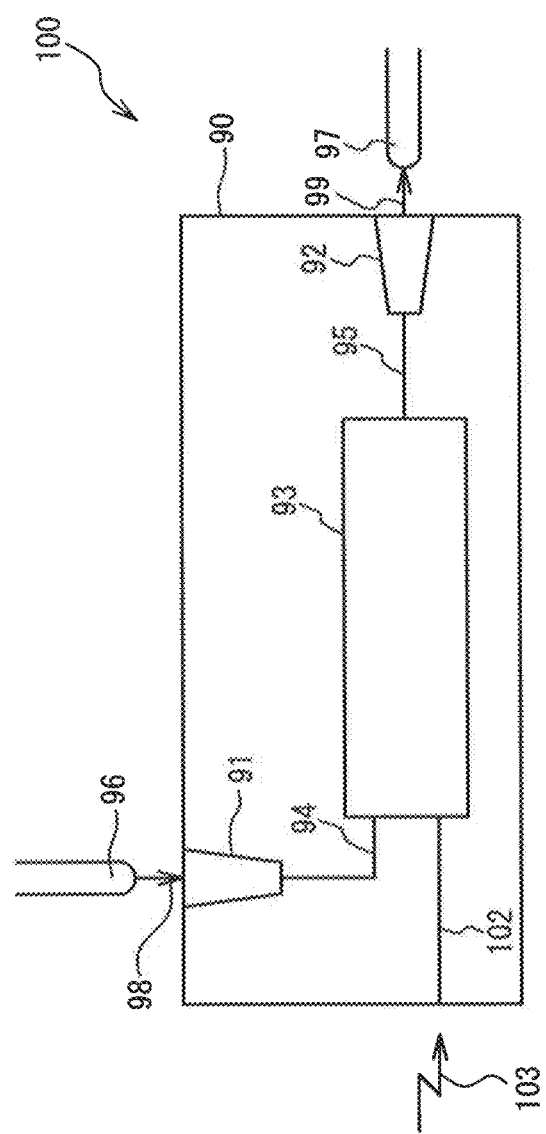
FIG. 16 is a block diagram of a system in which a semiconductor device according to a second embodiment is used.

A semiconductor layer formed in the first embodiment is used in a waveguide for a spot-size converter. FIG. 16 is a block diagram of a system in which a semiconductor device 100 according to a second embodiment is used. As shown in FIG. 16, spot-size converters 91 and 92, a Mach-Zehnder modulator 93, waveguides 94 and 95, and an interconnection 102 are disposed on a substrate 90. The spot-size converters 91 and 92, the Mach-Zehnder modulator 93, the waveguides 94 and 95 and the substrate 10 are composed of semiconductors. The interconnection 102 is composed of a metal. A laser light 98 is radiated from a lensed fiber 96 onto the spot-size converter 91. The spot-size converter 91 converts the spot site of the laser light 98 into the size of the waveguide 95. The Mach-Zehnder modulator 93 modulates an optical signal propagated through the waveguide 94 using an electrical signal 103 propagated through the interconnection 102. The Mach-Zehnder 93 outputs a modulated light to the waveguide 95. The spot-size converter 92 converts the spot size of the modulated light 99 into the size of the lensed fiber 97. In such a manner, the spot-size converters 91 and 92 have a function of converting the spot size of an optical signal.

FIGS. 17A to 32C are views showing a manufacturing method of a semiconductor device (spot-size converter) according to the second embodiment. Figures suffixed with "A", i.e., FIGS. 17A to 32A, and FIG. 25D are plan views; Figures suffixed with "B", i.e., FIGS. 17B to 32B, are cross-sectional views taken along the line A-A of FIGS. 17A to 32A, respectively; and Figures suffixed with "C", i.e., FIGS. 17C to 31C, are cross-sectional views taken along the line B-B of FIGS. 17A to 32A, respectively. FIGS. 25E, 31D, and 32C are cross-sectional views taken along the line C-C of FIGS. 25A, 31A, and 32A, respectively.

Referring to FIGS. 17A to 17C, a substrate 10 is prepared by forming an n-type P cladding layer on an InP substrate. Hereinafter, the InP substrate and the n-type InP cladding layer are shown as the substrate 10. The n-type InP cladding layer is grown using an MOVPE method, The growth pressure is $1 \times 10^4$ Pa, and the growth temperature is 650° C. and 600° C. The thickness of the n-type MP cladding layer is 2 µm. The principal surface of the substrate is the (100) plane, and the X direction corresponds to the [011] direction.

Figure 18C:
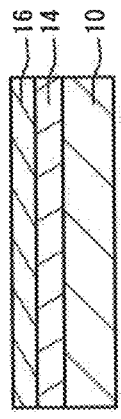
FIGS. 18A to 18C are views showing the manufacturing method of a semiconductor device according to the second embodiment (part 2).
Figure 18B:
Figure 18A:
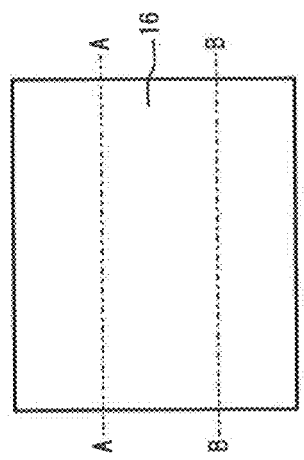

Referring to FIGS. 18A to 18C, an AlInAs layer as a first layer 14 and an InP layer as a second layer 16 are formed on the substrate 10. The first layer 14 and the second layer 16 are formed using an MOVPE method, The growth pressure is $1 \times 10^4$ Pa, and the growth temperature is 650° C. The thickness of the first layer 14 is 1.6 µm, and the thickness of the second layer 16 is 6 µm. Preferably, the first layer 14 is composed of $Al_{0.52}In_{0.48}As$ lattice-matched with the InP layer.

Referring to FIGS. 19A to 19C, an insulating layer 18 is formed on the second layer 16. The insulating layer 18 is composed of a silicon nitride film and formed using a sputtering method. The thickness of the insulating layer 18 is 0.6 µm. The insulating layer 18 may be composed of a silicon dioxide film.

Referring to FIGS. 20A to 20C, the insulating layer 18 is subjected to patterning using a photo-lithography technique and an etching method. The insulating layer 18 is formed in a first region 50, a second region 52, and a third region 54, and is removed from a fourth region 56. The fourth region 56 corresponds to an opening 19 of the insulating layer 18, and the surface of the second layer 16 is exposed at the opening 19. The first region 50 is elongated along the X direction. The width of the first region 50 is constant on the negative side of the position X0. The width of the first region 50 decreases in the X direction on the positive side of the position X0.

Figure 21A:
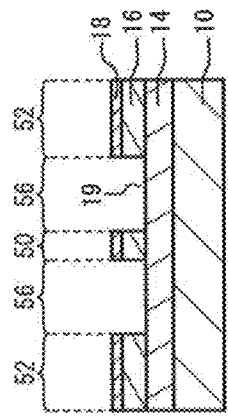
FIGS. 21A to 21C are views showing the manufacturing method of a semiconductor device according to the second embodiment (part 5).
Figure 21B:
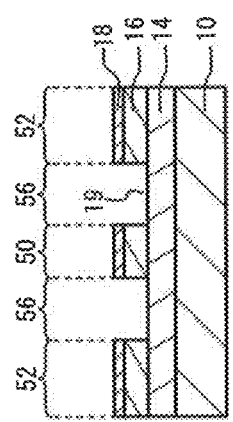
Figure 21C:
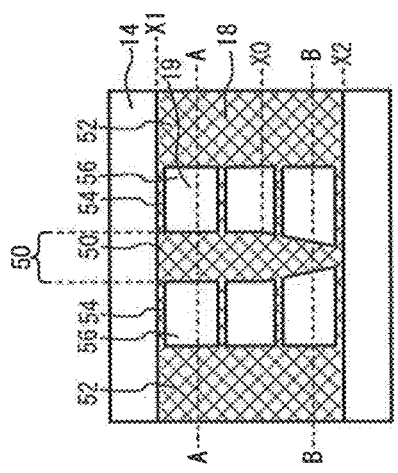

Referring to FIGS. 21A to 21C, the second layer 16 is subjected to dry etching using the insulating layer 18 as a mask. By controlling the etching time on the basis of the etching rate obtained in advance, dry etching is performed until the first layer 14 is exposed at a desired opening. There is no problem unless the etching reaches the substrate 10. However, the dry etching amount is preferably determined such that the first layer 14 remains with a thickness of 1 µm or more in order to prevent damage on the substrate 10. Accordingly, the opening 19 is formed in the second layer 16, and the first layer 14 is exposed at the opening 19.

Figure 22B:
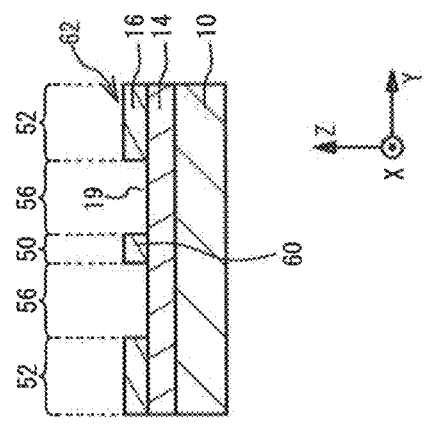
FIGS. 22A to 22C are views showing the manufacturing method of a semiconductor device according to the second embodiment (part 6).
Figure 22C:
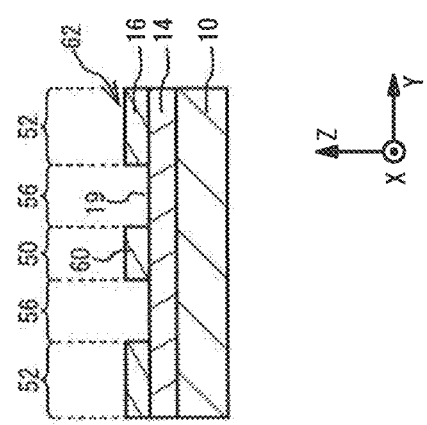
Figure 22A:
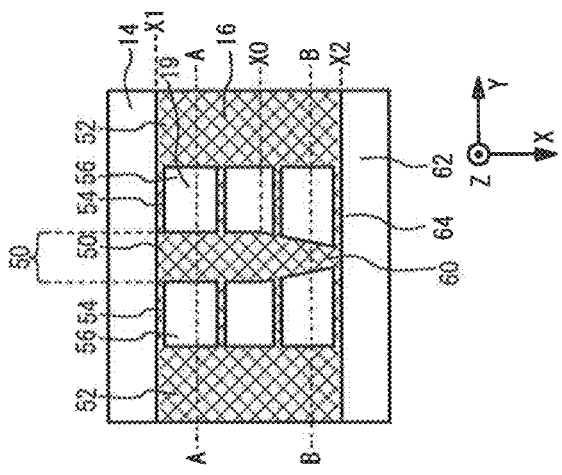

Referring to FIGS. 22A to 22C, the insulating layer 18 is removed, Buffered hydrofluoric acid is used to remove the insulating layer 18, Then, washing with water and drying are performed.

Figure 23A:
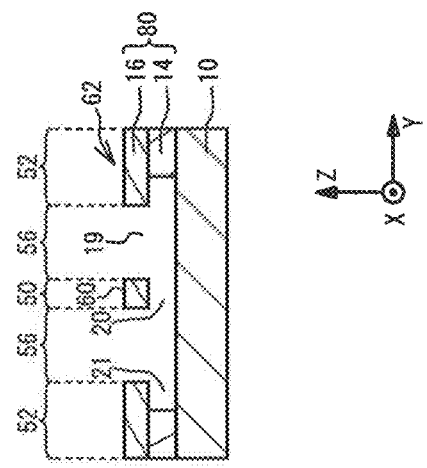
FIGS. 23A to 23C are views showing the manufacturing method of a semiconductor device according to the second embodiment (part 7).
Figure 23B:
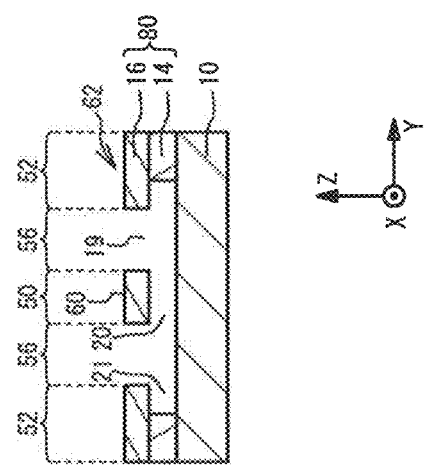
Figure 23C:
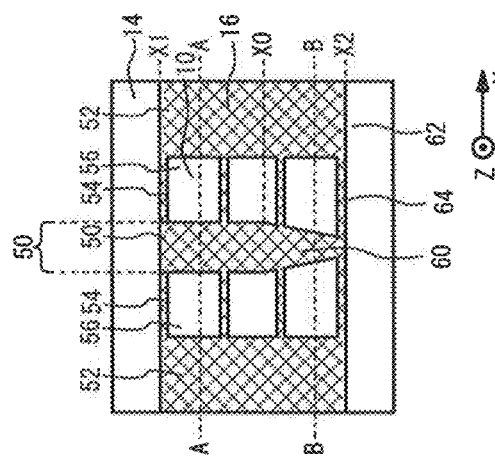

Referring to FIGS. 23A to 23C, using the second layer 16 as a mask, the first layer 14 in the first region 50, the third region 54, and the fourth region 56 is etched. As the etchant, a solution of sulfuric acid:hydrogen peroxide:water=1:1:1 is used. This etching solution etches AlInAs and does not etch InP. Thereby, an opening 19 is formed in the first layer 14, and the surface of the substrate 10 is exposed at the opening 19, The first layer 14 in the first region 50 and the third region 54 is removed, and a hollow space 20 is formed under the second layer 16 in the first region 50. Near the edge of the second region 52, the first layer 14 is partially removed by side-etching, and a void 21 is formed. Then, washing with water and drying are performed. Thus, a suspended mask 80 is formed from the first layer 14 and the second layer 16. The second layer 16 in the first region 50 serves as a shield portion 60. The first layer 14 and the second layer 16 in the second region 52 serve as a terrace portion 62. The second layer 16 in the third region 54 serves as a supporting portion 64.

Figure 24B:
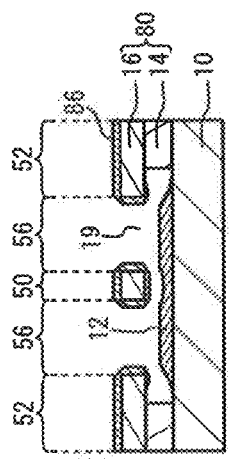
FIGS. 24A to 24C are views showing the manufacturing method of a semiconductor device according to the second embodiment (part 8).
Figure 24C:
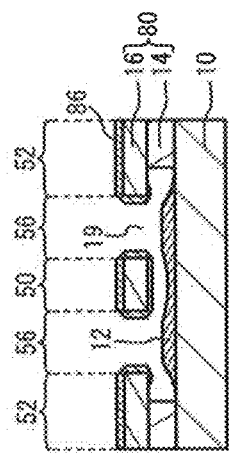
Figure 24A:
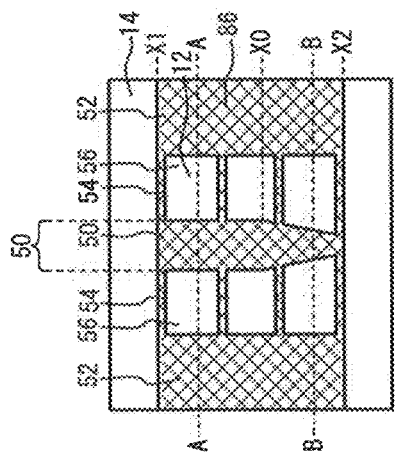

Referring to FIGS. 24A to 24C, using the suspended mask 80, a semiconductor layer 12 is formed on the substrate 10. The semiconductor layer 12 is grown using an MOVPE method, The growth pressure is $1 \times 10^4$ Pa, and the growth temperature is 650° C. and 530° C. In the semiconductor layer 12, an InP buffer layer with a thickness of 20 nm and an AlGaInAs MQW layer with a thickness of 400 um are formed in that order on the substrate 10 at a growth temperature of 650° C. Subsequently, an undoped InP cladding layer with a thickness of 400 nm is formed on the MQW layer at a growth temperature of 530° C. At the same time, a semiconductor layer 86 is formed on the upper surface, the lower surface, and the side surface of the suspended mask 80.

With reference to FIGS. 25A to 25E, the second layer 16 and the layer 86 are subjected to a lift-off process. In the lift-off process the first layer 14 in the second region 52 is etched and the second layer 16 is relieved from the substrate 10, As an etchant, a solution of sulfuric acid:hydrogen peroxide:water of 1:1:1 is used. Since this etching solution does not substantially etch InP, the semiconductor layer 12 and the substrate 10 are not substantially etched.

Figure 25B:
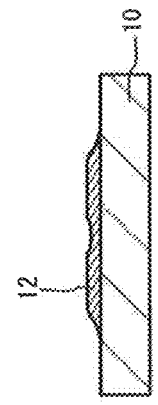
FIGS. 25A to 25E are views showing the manufacturing method of a semiconductor device according to the second embodiment (part 9).
Figure 25C:
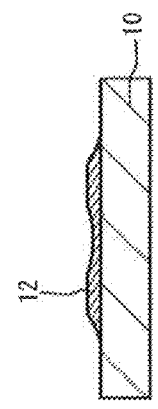
Figure 25A:
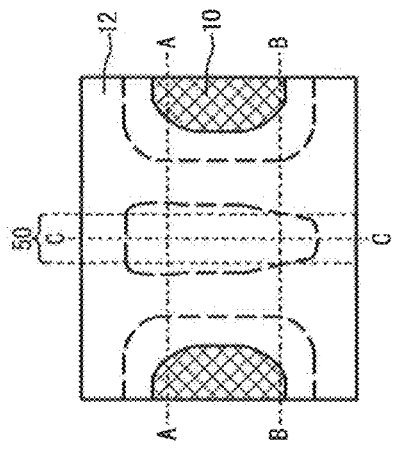
Figure 25E:
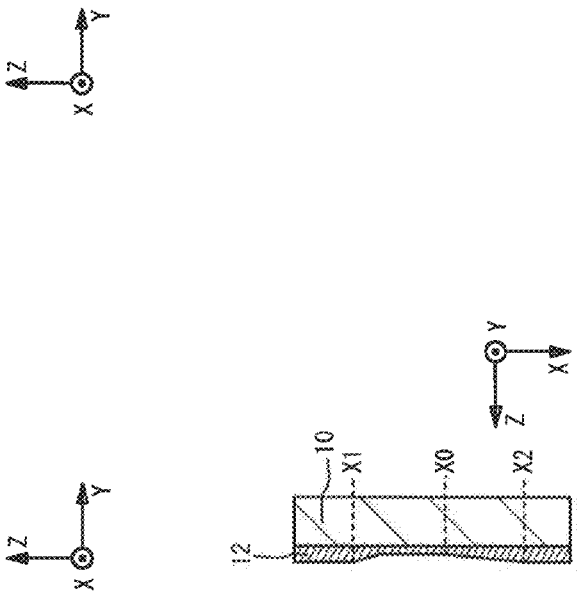
Figure 25D:
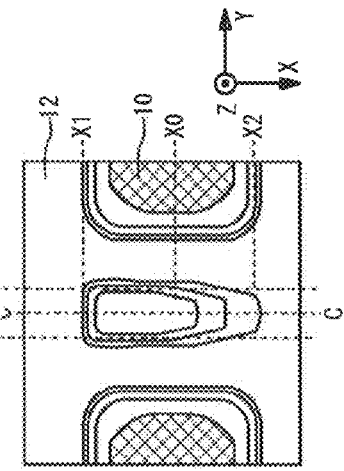

In FIG. 25A, the broken line indicates a contour line of the thickness of the semiconductor layer 12. In FIG. 25D, solid lines indicate contour lines of the thickness of the semiconductor layer 12. As shown in FIGS. 25B and 25C, a recessed portion is formed in the semiconductor layer 12 disposed in the first region 50. The recessed portion is extending along the X direction (a first direction). On the line C-C (centerline of the first region 50) between X0 and X2 in the recessed portion, the thickness of the semiconductor layer 12 increases as X increases. This recessed portion in the semiconductor layer 12 is a influence of the shield portion 60.

Figure 26A:
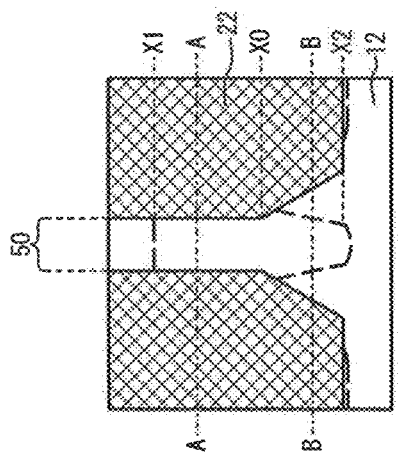
FIGS. 26A to 26C are views showing the manufacturing method of a semiconductor device according to the second embodiment (part 10).
Figure 26B:
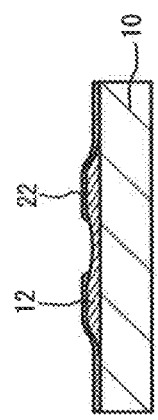
Figure 26C:
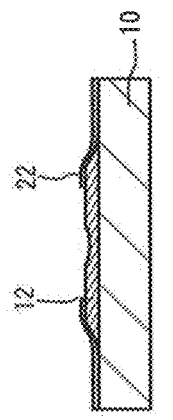

Next, the manufacturing process of a waveguide mesa will be explained. The waveguide mesa is made using the semiconductor layer 12. The waveguide mesa is used for a spot-size converter. Referring to FIGS. 26A to 26C, an insulating layer 22 is formed on the substrate 10 and the semiconductor layer 12. The insulating layer 22 is composed of a silicon nitride film and is formed using a sputtering method. The thickness of the insulating layer 22 is 0.2 µm. The insulating layer 22 may be composed of a silicon dioxide film, The insulating layer 22 is subjected to patterning using a photo-lithography technique and an etching method. The insulating layer 22 is removed in the first region 50. The width of the opening formed in the insulating layer 22 is substantially constant on the negative side of the position X0. The width of the opening formed in the insulating layer 22 increases in the X direction on the positive side of the position X0. The insulating layer 22 is removed on the positive side of the position X2. Note that the changing point of the width of the opening may be a position other than the position X0 or X2. The width of the opening in the insulating layer 22 is larger that of the first region 50.

Referring to FIGS. 27A to 27C, a semiconductor layer 24 is formed using the insulating layer 22 as a mask. The semiconductor layer 24 is grown using an MOVPE method. The semiconductor layer 24 is formed in the opening and in the area where the insulating layer 22 is removed. The growth pressure is $1 \times 10^4$ Pa, and the growth temperature is 600° C. and 530° C. As the semiconductor layer 24, an undoped InP cladding layer with a thickness of 100 nm, a p-type InP cladding layer with a thickness of 800 nm, and a p-type InGaAsP intermediate layer with a thickness of 100 nm are formed in that order on the semiconductor layer 12 at a growth temperature of 600° C. A p-type GaInAs contact layer is grown on the intermediate layer at a growth temperature of 530° C. The InGaAsP intermediate layer is a layer which is lattice-matched with InP and whose composition gradually changes from InP to GaInAs. The p-type GaInAs contact layer is composed of $In_{0.53}Ga_{0.47}As$.

The thickness of the semiconductor layer 24 depends on the opening width W8 in the Y direction of the insulating layer 22 serving as the mask. When the opening width W8 is large, the thickness of the semiconductor layer 24 is small. When the opening width W8 is small, the thickness of the semiconductor layer 24 is large.

Referring to FIGS. 28A to 28C, the insulating layer 22 is removed. Buffered hydrofluoric acid is used to remove the insulating layer 22. Then, washing with water and drying are performed.

Figure 29C:
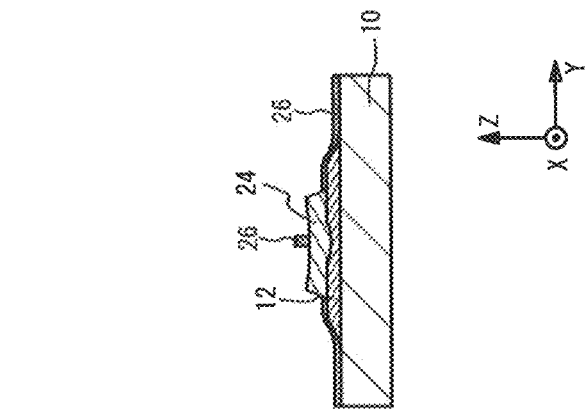
FIGS. 29A to 29C are views showing the manufacturing method of a semiconductor device according to the second embodiment (part 13).
Figure 29B:
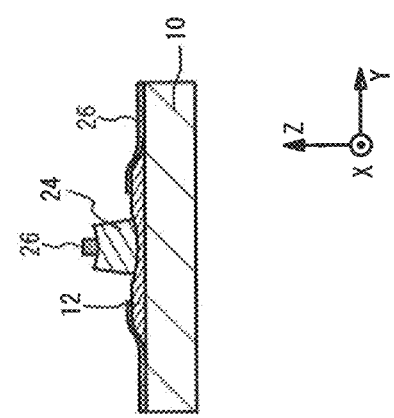
Figure 29A:
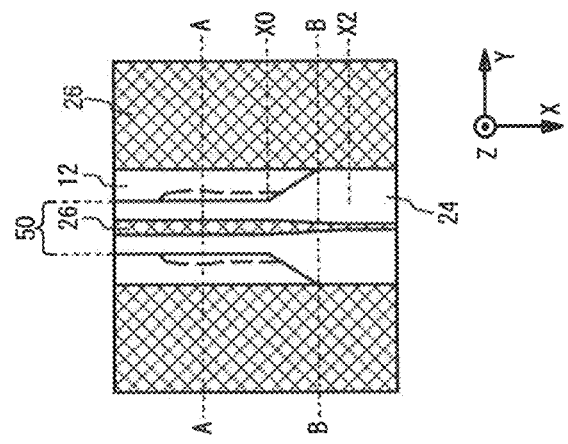

Referring to FIGS. 29A to 29C, an insulating layer 26 is formed on the substrate 10 and the semiconductor layers 12 and 24. The insulating layer 26 is composed of a silicon nitride film and is formed using a sputtering method. The thickness of the insulating layer 26 is 0.6 μm. The insulating layer 26 may be composed of a silicon dioxide film, The insulating layer 26 is subjected to patterning using a photolithography technique and an etching method. The insulating layer 26 is divided into three sections: a central section in the Y direction of the first region 50, a section on the +Y side of the first region 50, and a section on the −Y side of the first region 50. The central section is overlying on the first region 50. The width of the central section is smaller than the width of the first region 50. The width of the insulating layer 26 is constant on the negative side of the position X0 and on the positive side of the position X2. The width of the insulating layer 26 decreases in the X direction between the positions X0 and X2. The distance between the section on the +Y side and the section on the −Y side is constant.

Figure 30A:
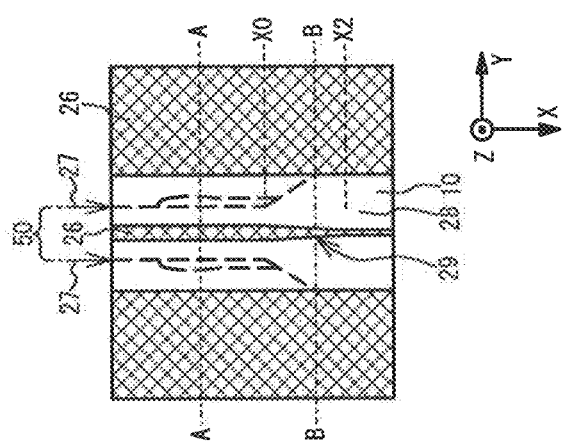
FIGS. 30A to 30C are views showing the manufacturing method of a semiconductor device according to the second embodiment (part 14).
Figure 30B:
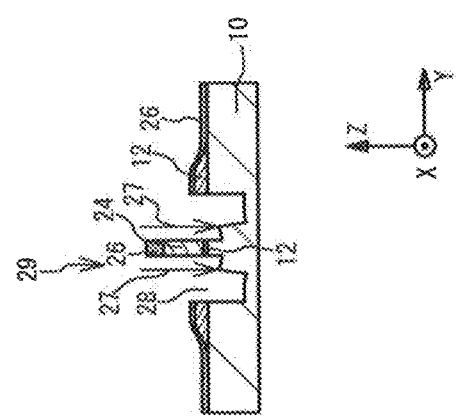
Figure 30C:
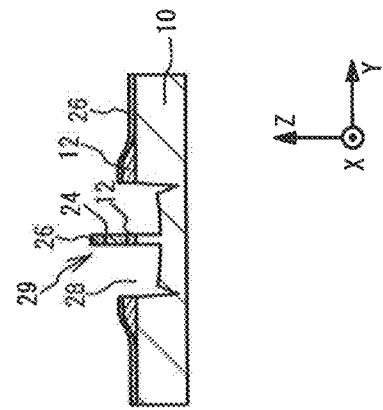
Figure 31B:
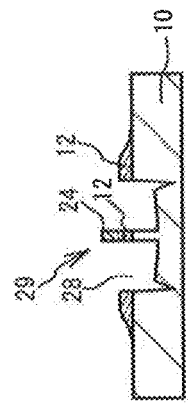
FIGS. 31A to 31D are views showing the manufacturing method of a semiconductor device according to the second embodiment (part 15).
Figure 31C:
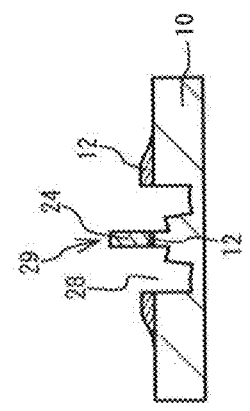
Figure 31D:
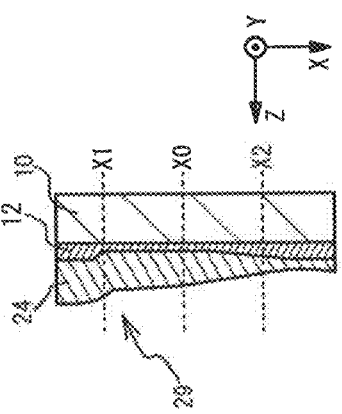

Referring to FIGS. 30A to 30C, the semiconductor layers 12 and 24 and the substrate 10 are dry-etched using the insulating layer 26 as a mask. A chlorine-based gas is used for the dry etching. Thereby, a waveguide mesa 29 is formed. The waveguide mesa 29 includes the semiconductor layer 12 and the semiconductor layer 24. Both side of the waveguide mesa 29, depressions 28 are formed in the substrate 10. The depressions 28 are reflections of the shape of the insulating layer 22. Under the influence of the semiconductor layer 24, steps 27 are formed in the substrate 10 in the depressions 28.

Figure 31A:
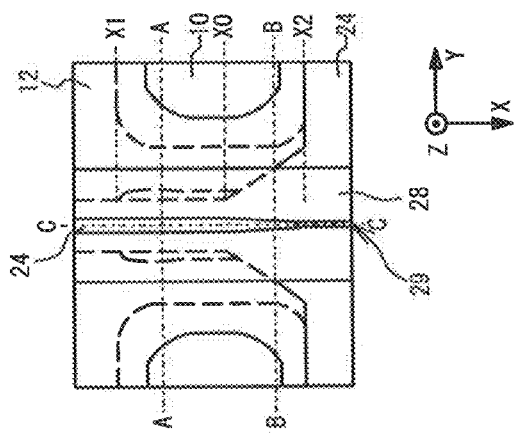

Referring to FIGS. 31A to 31D, the insulation layer 26 is removed. Buffered hydrofluoric acid is used to remove the insulating layer 26. Then, washing with water and drying are performed. The width and height of the waveguide mesa 29 are substantially constant between the vicinity of the position X1 and the position X0. As shown in FIG. 31A, the width of the waveguide mesa 29 gradually decreases in the +X direction between the position X0 to the position X2. As shown in FIG. 31D, the thickness of the semiconductor layer 12 in the waveguide mesa 29 increases in the +X direction between the position X0 and the position X2. The thickness of the semiconductor layer 24 in the waveguide mesa 29 decreases in the +X direction, Referring to FIGS. 32A to 32C, the substrate 10 is cleaved along the line A-A. Thus, a spot-size converter 35 is formed. In the waveguide mesa 29 of the spot-size converter 35, the semiconductor layer 12 acts as a core layer where a light is guided. And the semiconductor layer 24 acts as a cladding layer which funnels the light into the core layer, The width of the waveguide mesa 29 decreases in the +X direction. The thickness of the semiconductor layer 12 decreases in the +X direction. Accordingly, when a light incident from the cleaved facet (line A-A), the spot size of the light decreases as the light travels to the +X direction, The thickness of the semiconductor layer 24 is large at the cleaved facet (line A-A). Thus, the fiat of large spot size is effectively received in the waveguide mesa 29. The thickness of the semiconductor layer 24 decreases in the +X direction. When a light comes from the positive side of the X direction to the waveguide mesa 29, the spot size of the light increases as it travels toward the cleaved facet (line A-A).

In accordance with the second embodiment, as shown in FIGS. 18A to 18C, the first layer 14 is formed on the substrate 10, and the second layer 16 is formed on the first layer 14, As shown in FIGS. 21A to 23C, the second layer 16 is made to remain and the first layer 14 is removed in the first region 50 and the third region 54, the first layer 14 and the second layer 16 are made to remain in the second region 52, and the first layer 14 and the second layer 16 are removed in the fourth region 56. Thus, the suspended mask 80 is formed. As shown in FIGS. 24A to 24C, using the suspended mask 80, the semiconductor layer 12 is deposited on the substrate 10. Accordingly, as in the first embodiment, the thickness is varied in the first direction of the suspended mask 80. Furthermore, the quality of the semiconductor layer 12 is uniform. Moreover, the control of the thickness is facilitated.

Furthermore, the suspended mask 80 is formed as follows. As shown in FIGS. 21A to 21C, the second layer 16 in the fourth region 56 is removed such that the second layer 16 remains in the first region 50, the second region 52, and the third region 54. As shown in FIGS. 23A to 23C, using, as a mask, the second layer 16 remaining in the first region 50, the second region 52, and the third region 54, the first layer 14 in the first region 50, the third region 54, and the fourth region 56 is removed. Thus, the suspended mask 80 can be simply formed.

Third Embodiment

Figure 33A:
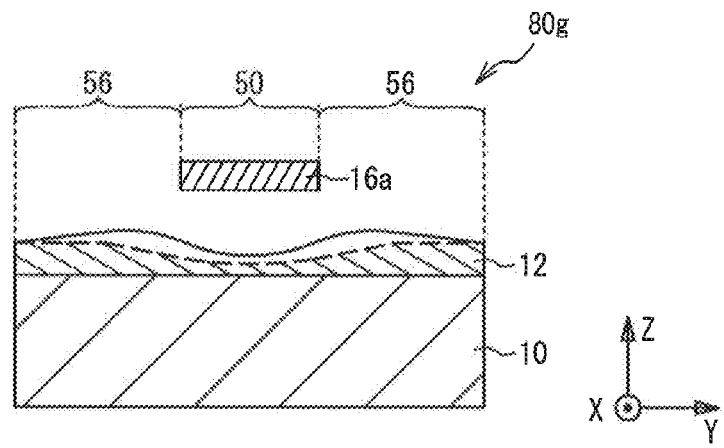
FIGS. 33A to 33C are cross-sectional views showing a process of forming a semiconductor layer in a third embodiment.
Figure 33B:
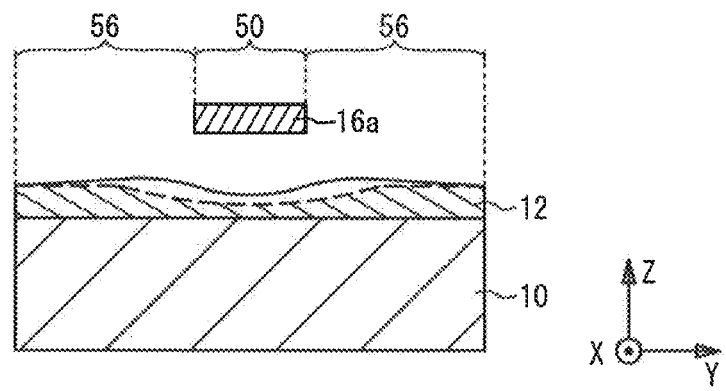
Figure 33C:
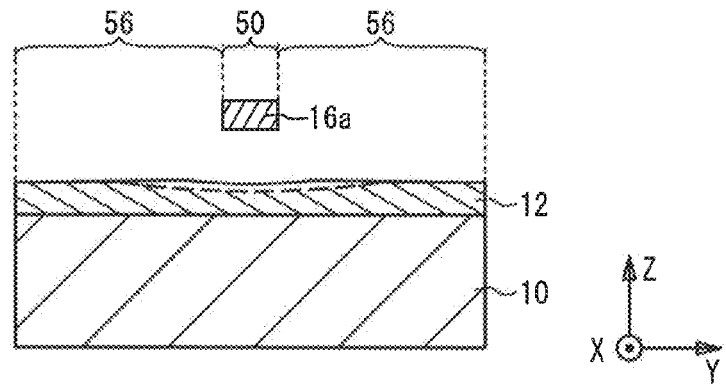

FIGS. 33A to 33C shows the shape of a suspended mask 80g of the third embodiment. FIGS. 33A to 33C are cross-sectional views showing the process of forming a semiconductor layer in accordance with a third embodiment. FIGS. 33A to 33C show a first region 50 and fourth regions 56. In the third embodiment, a second layer 16a is made of an insulating layer. As the second layer 16a, for example, a silicon dioxide film or a silicon nitride film is used. In FIGS. 33A to 33C, the solid line in the semiconductor layer 12 indicates the surface of the semiconductor layer 12 formed using the suspended mask 80g. The broken line indicate the semiconductor layer 12 of the first embodiment in which the second layer 16 is composed of a semiconductor.

When the second layer 16a is formed of an insulating layer, no semiconductor layer is formed around the second layer 16a. On the other hand, as shown in FIGS. 6A to 6C in the first embodiment, the semiconductor layer 86 is formed on and under the second layer 16. The source gases consumed for forming the layer 86 in the first embodiment are supplied to the semiconductor layer 12 in the third embodiment. In the third embodiment, the thickness of the semiconductor layer 12 is larger than that in the first embodiment. Therefore, in the third embodiment, the variation of the thickness of the semiconductor layer 12 is smaller than in the first embodiment. To obtain the large variation, the width W1 should be further increased. Though the quality of crystalline film becomes non-uniform at a larger width W1.

As in the third embodiment, the second layer 16a may be formed of an insulating layer. However, in order to make the quality of the semiconductor layer 12 more uniform, the second layer 16a is preferably composed of a semiconductor as in the first embodiment. Preferably, the semiconductors are composed of materials which are epitaxially grown on one another. In order to form the second layer 16 composed of a semiconductor, the first layer 14 is preferably composed of a semiconductor. in the case where the second layer 16a is formed of an insulating layer, the first layer 14 can be composed of a semiconductor. In this case, the semiconductor may be composed of a material which is not epitaxially grown as long as it can be selectively etched from the insulating layer and the substrate 10.

Fourth Embodiment

In the fourth embodiment, a substrate 10 is composed of InP having a (001) principal surface, a first layer 14 is composed of GaInAs, and a second layer 16 is composed of InP. Using an etching solution containing hydrogen peroxide for etching the second layer 16, a suspended mask 80h is formed.

Figure 34:
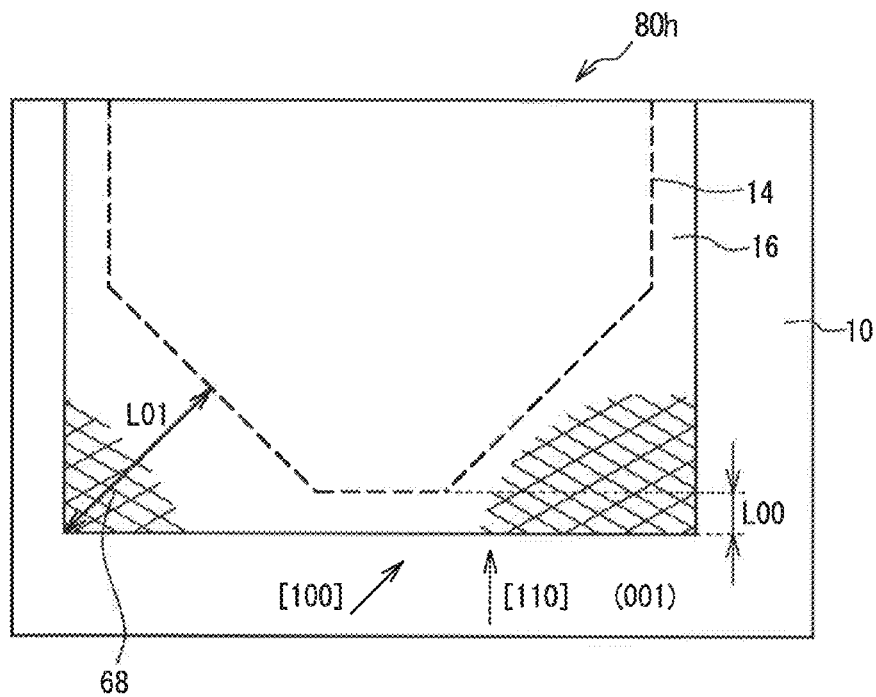
FIG. 34 is a plan view of a suspended mask after a first layer has been etched.

When the first layer 14 is composed of GaInAs, a large side-etching occurs in the wet etching in the direction of [100]. FIG. 34 is a plan view of the corner of the suspended mask 80h after the first layer has been etched. Referring to FIG. 34, when the first layer 14 is etched using the second layer 16 as a mask, the first layer 14 is largely side-etched at the corner. The side etching amount L00 in the [110] direction is 14.3 μm, and the side etching amount L01 in the [100] direction is 69.7 μm. As a result, a corner 68 of the second layer 16 sags and comes into contact with the substrate 10.

Figure 35:
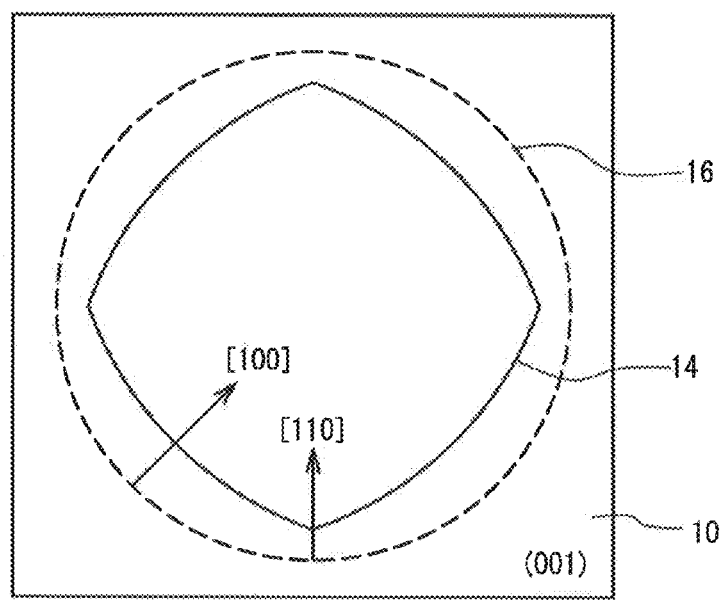
FIG. 35 is a plan view of an experimental result of the side etching amount in the different direction after a first layer has been etched.

FIG. 35 is an experimental result to examine the side etching amount in the different direction. FIG. 35 is a plan view after the first layer has been etched. Referring to FIG. 35, a circular shaped second layer 16 is used as a mask and a first layer 14 is etched. The side etching amount of the first layer 14 in the [100] direction is larger than that in the direction. This shows that the etching rate in the [100] direction is higher than that in the [110] direction.

Figure 37A:
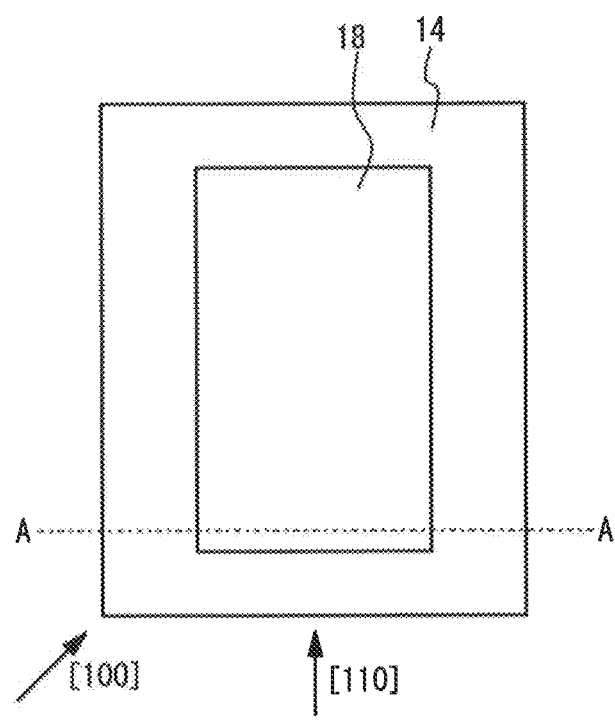
FIGS. 37A and 37B are views showing a method for forming a suspended mask according to the fourth embodiment (part 1).
Figure 37B:
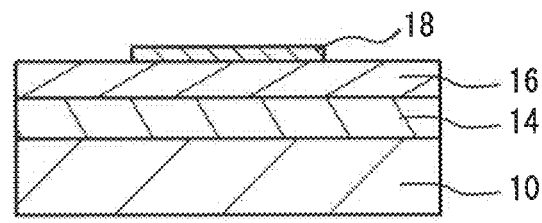
Figure 38A:
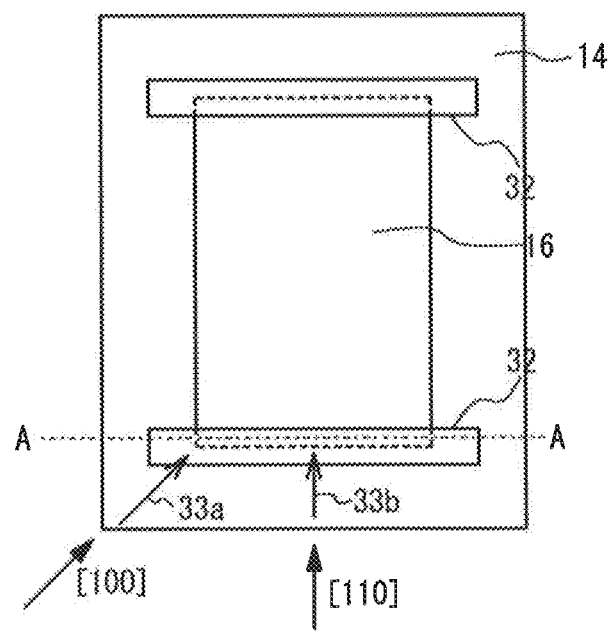
FIGS. 38A and 38B are views showing a method for forming a suspended mask according to the fourth embodiment (part 2).
Figure 38B:
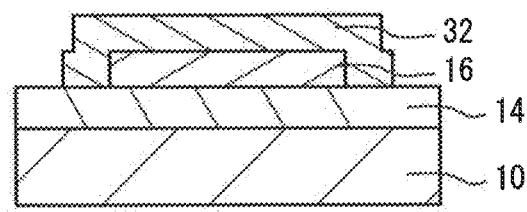

FIGS. 36A to 36G are cross-sectional views showing a method for forming a suspended mask 80h according to the fourth embodiment. FIGS. 36A to 36G show the corner of a terrace portion of the suspended mask 80h. Cross-sectional views in the two different directions [110] and [100] are shown in one figure. The cross-sectional view of the [110] direction is shown on the right side of the centerline (dashed line), and a cross-sectional in the [100] direction is shown on the left side of the centerline (dashed line). FIGS. 37A and 38A are plan views showing a method for forming the suspended mask 80h according to the fourth embodiment. FIGS. 37B and 38B are cross-sectional views taken along the fine A-A of FIGS. 37A and 38A, respectively.

Figure 36A:
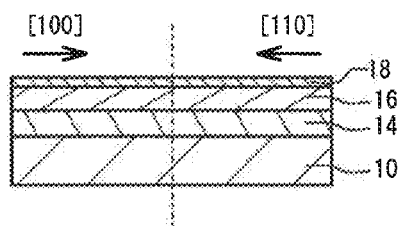
FIGS. 36A to 36G are cross-sectional views showing a method for forming a suspended mask according to a fourth embodiment.
Figure 36E:
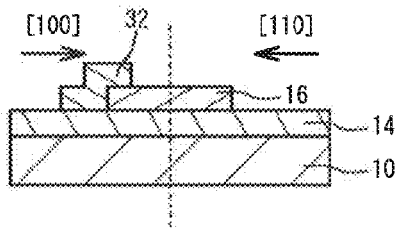
Figure 36B:
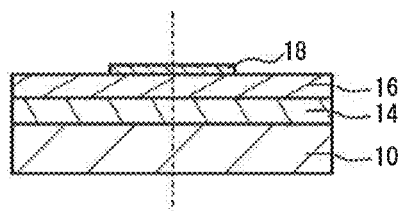

Referring to FIG. 36A, a GaInAs layer is formed as a first layer 14 on a (001) InP substrate 10. An MP layer is formed as a second layer 16 on the first layer 14. An insulating layer 18 is formed on the second layer 16. Referring to FIG. 36B, the insulating layer 18 is subjected to patterning. Referring to FIGS. 37A and 37B, the insulating layer 18 has a rectangular shape having sides in the [110] direction, The apex of the insulating layer 18 is directed in the [100] direction.

Figure 36F:
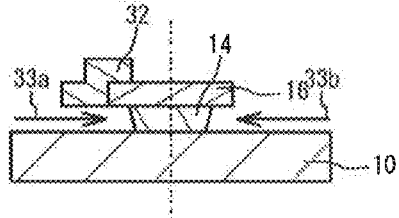
Figure 36C:
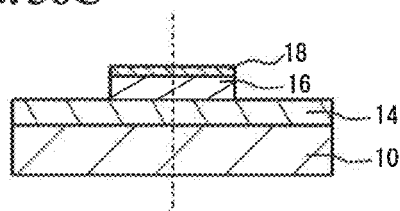
Figure 36G:
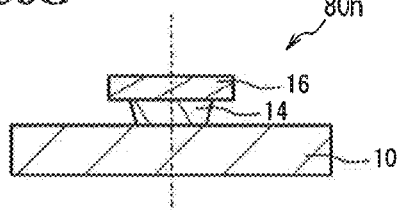
Figure 36D:
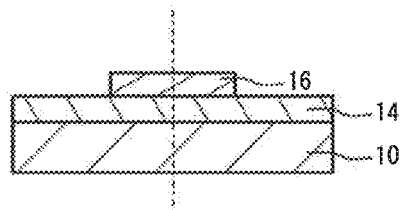

Referring to FIG. 36C, using the insulating layer 18 as a mask, the second layer 16 is removed, The second layer 16 has a rectangular shape having sides in the [110] direction. The apex of the second layer 16 is directed in the [100] direction. Referring to FIG. 36D, the insulating layer 18 is removed. Referring to FIG. 36E, an insulating layer 32 is formed.

As shown in FIGS. 38A and 38B, the insulating layer 32 covers the apexes of the second layer 16. The [110] direction crossing the side of the second layer 16 is defined as a direction 33b, and the [100] direction passing through the apex is defined as a direction 33a. Referring to FIG. 36F, using the insulating layer 32 and the second layer 16 as masks, the first layer 14 is etched with a sulfuric acid-based etching solution. The side etching amount in the direction 33a is larger than that in the direction 33h. Referring to FIG. 36G, the insulating layer 32 is removed.

Since the apex of the second layer 16 is covered with the insulating layer 32, side etching of the first layer 14 in the [100] direction is suppressed.

Figure 39:
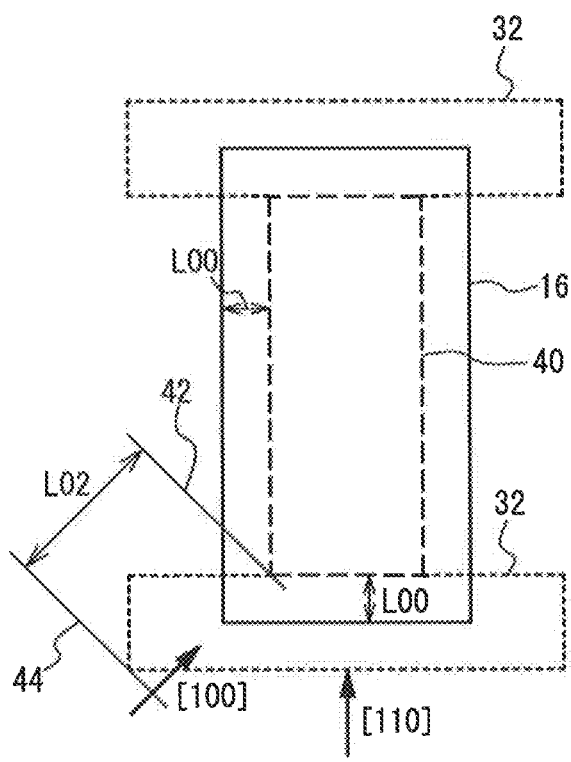
FIG. 39 is a plan view showing the relationship between a second layer and a second insulator mask.

FIG. 39 is a plan view showing the relationship between the second layer and the insulating layer. Referring to FIG. 39, L00 is the amount of side etching of the first layer 14 in the [110] direction in which only the second layer 16 is used as a mask. A pattern 40 corresponds to a shape of the first layer 14 with a side etching in which only the second layer 16 is used as a mask. The distance between the apex of the pattern 40 and the apex of the insulating mask 32 is denoted by L02. The relationship between L00 and L02 is as follows (according to FIG. 34); L02=5×L00. Therefore, preferably, the distance L02 is 5 times or more the amount L00. Thus, the eaves of the apex is kept small and the sagging of the apex is avoided.

In accordance with the fourth embodiment, when the second layer 16 is composed of GaInAs, by using the insulating layer 32, the amount of the side etching of the corner is effectively reduced.

Fifth Embodiment

Figure 41A:
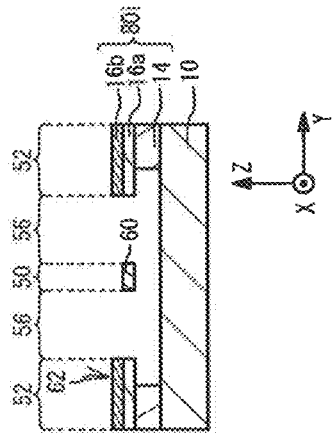
FIGS. 41A to 41E are views showing the manufacturing method according to the fifth embodiment (part 2).
Figure 41B:
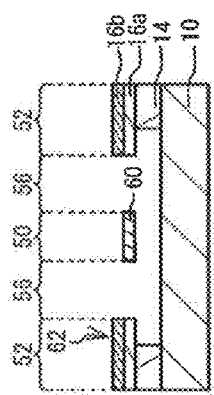
Figure 41C:
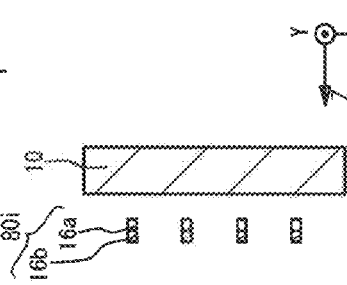
Figure 41D:
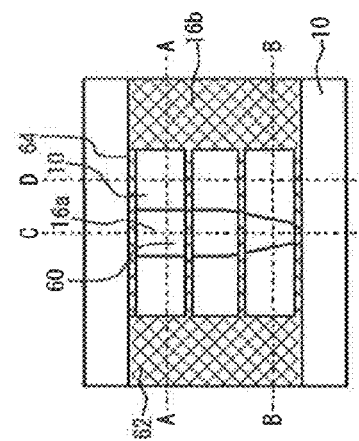
Figure 41E:
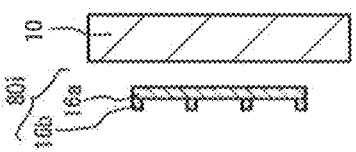

A fifth embodiment relates to an example of a method for forming a suspended mask 80I in which the thickness of the second layer in the first region is smaller than that in the third region. FIGS. 40A to 41A are views showing a manufacturing method according to the fifth embodiment. FIGS. 40A and 41A are plan views. FIGS. 40B and 41B are cross-sectional views taken along the line A-A of FIGS. 40A and 41A, respectively. FIGS. 40C and 41C are cross-sectional views taken along the line B-B of FIGS. 40A and 41A, respectively, FIGS. 40D and 41D are cross-sectional views taken along the line C-C of FIGS. 40A and 41A, respectively. FIGS. 40E and 41E are cross-sectional views taken along the line D-D of FIGS. 40A and 41A, respectively.

Referring to FIGS. 40A to 40E, a second layer 16 includes a third layer 16a and a fourth layer 16b disposed on the third layer 16a. The third layer 16a and the fourth layer 16b are, for example, an InP layer and a GaInAs layer, respectively. After the process shown in FIGS. 22A to 22C in the second embodiment, an insulating layer 46 is formed, The insulating layer 46 covers the second region 52 and the third region 54. No insulating layer 46 is formed in the first region 50. Then, using the insulating layer 46 as a mask, the fourth layer 16b is etched. The fourth layer 16b in the first region 50 is etched while the fourth layer 16b in the third region 54 remains.

Referring to FIGS. 41A to 41E, in the process shown in FIGS. 23A to 23C in the second embodiment, an opening 19, a hollow space 20, and a void 21 are formed, and at the same time. After removing the insulating layer 46, the thinner first region 50 compared to the third region 54 is obtained.

The shield portion 60 does not sag if the thickness H2 of the second layer 16 approximately satisfies the following formula:

$$H2 \geq \alpha \times (W5)^2 \times (1+(Vm/Vs)),$$

where W5 is the distance between the second regions 52 in FIG. 10, Vm is the volume of the shield portion 60, Vs is the volume of the supporting portion 64, and α is a constant specific to the material. The density in the second layer 16 is assumed to be uniform.

As is obvious from the above, in order to decrease the thickness H2, Vm/Vs is decreased.

In accordance with the fifth embodiment, the second layer 16 in the first region 50 is thinner than the second layer 16 in the third region 54. Thus, the shield portion 60 is made thinner than the supporting portion 64. Therefore, Vm/Ns can be decreased. Accordingly, even when the thickness of the second layer 16 of the supporting portion 64 is decreased, the shield portion 60 is unlikely to sag.

The embodiments of the present invention have been described in detail above. However, it is to be understood that the present invention is not limited to such specific embodiments. Various modifications and changes can be made within the gist described in the claims.

What is claimed is:

1. A method for manufacturing a semiconductor device, comprising the steps of:
   preparing a substrate having a first region, a second region, a third region, and a fourth region;
   forming a first layer on the substrate and a second layer on the first layer;
   forming a suspended mask on the substrate by etching the first layer and the second layer, the suspended mask including a shield portion having a space between the second layer and the substrate at the first region, a terrace portion being disposed apart from the shield portion at the second region, a supporting portion connecting the shield portion and the terrace portion at the third region, and an opening between the shield portion and the terrace portion at the fourth region, the shield portion extending in a first direction; and
   growing a semiconductor layer on a surface of the substrate in the first region and the fourth region using the suspended mask,
   wherein the shield portion of the suspended mask has a width varying in the first direction, and
   the semiconductor layer has a thickness varying in the first direction.

2. The method for manufacturing a semiconductor device according to claim 1, further comprising the steps of:
   removing the suspended mask by etching the first layer using a wet etching method;
   forming a cladding layer on the semiconductor layer using a selective area growth mask; and
   forming a waveguide mesa by etching the semiconductor layer and the cladding layer,
   wherein the cladding layer has a thickness varying in the first direction, and the waveguide mesa has a width varying in the first direction.

3. The method for manufacturing a semiconductor device according to claim 1,
   wherein the step of forming a suspended mask includes the steps of:
   forming an insulator mask on the second layer, the insulator mask having a pattern on the first region, the second region, and the third region;
   etching the second layer using the insulator mask to form a semiconductor mask composed of the second layer remaining in the first region, the second region, and the third region; and
   selectively etching the first layer in the first region, the third region, and the fourth region by wet etching using the semiconductor mask as an etching mask.

4. The method for manufacturing a semiconductor device according to claim 1, wherein the semiconductor layer is made of AlGaInAs, AlInAs, or GaInAs.

5. The method for manufacturing a semiconductor device according to claim 1, wherein the first layer and the second layer are each composed of a semiconductor material.

6. The method for manufacturing a semiconductor device according to claim 1, wherein the first region has a distance of 18 to 100 μm from the second region.

7. The method for manufacturing a semiconductor device according to claim 1, wherein the second layer has a thickness of 3 to 8 μm.

8. The method for manufacturing a semiconductor device according to claim 1, wherein the supporting portion in the third region is formed symmetrically with respect to a center line of the shield portion in the first region.

9. The method for manufacturing a semiconductor device according to claim 1, wherein the second layer in the shield portion is thinner than the second layer in the supporting portion.

10. The method for manufacturing a semiconductor device according to claim 1,
    wherein the step of forming the suspended mask further includes the steps of:
    forming a first insulator mask on the second layer, the first insulator mask having a pattern on the first region, the second region, and the third region;
    etching the second layer using the first insulator mask to form a semiconductor mask composed of the second layer remaining in the first region, the second region, and the third region;
    forming a second insulator mask on the second layer, the second insulator mask having a pattern covering a corner of the terrace portion; and
    selectively etching the first layer by wet etching using the semiconductor mask and the second insulator mask.

11. The method for manufacturing a semiconductor device according to claim 1, wherein, in the step of growing the semiconductor layer, the semiconductor layer is grown by supplying a source gas onto the surface of the substrate through the opening.

* * * * *